United States Patent
Hyatt

[11] 4,016,540
[45] Apr. 5, 1977

[54] APPARATUS AND METHOD FOR PROVIDING INTERACTIVE AUDIO COMMUNICATION

[76] Inventor: Gilbert Peter Hyatt, P.O. Box 4584, Anaheim, Calif. 92803

[22] Filed: Jan. 22, 1973

[21] Appl. No.: 325,933

Related U.S. Application Data

[63] Continuation-in-part of Ser. Nos. 101,881, Dec. 28, 1970, and Ser. No. 134,958, April 19, 1971, and Ser. No. 135,040, April 19, 1971, and Ser. No. 230,872, March 1, 1972, and Ser. No. 232,459, March 7, 1972, and Ser. No. 246,867, April 24, 1972, and Ser. No. 288,247, Sept. 11, 1972, and Ser. No. 229,213, April 13, 1972, Pat. No. 3,820,894, and Ser. No. 291,394, Sept. 22, 1972, and Ser. No. 302,771, Nov. 1, 1972.

[52] U.S. Cl. .................... 340/172.5; 179/1 SM
[51] Int. Cl.² ................ G06F 3/16; H04M 1/00
[58] Field of Search ....... 340/172.5, 149 R, 152 R, 340/153; 179/100.2 R, 1 SA, 1 SM; 444/1

[56] References Cited

UNITED STATES PATENTS

| | | | |
|---|---|---|---|
| 3,088,661 | 5/1963 | Brigham et al. | 179/100.2 R X |
| 3,142,820 | 7/1964 | Daniels | 340/172.5 |
| 3,209,074 | 9/1965 | French | 179/1 SM |
| 3,297,107 | 1/1967 | Shipp | 179/100.2 R X |
| 3,332,071 | 7/1967 | Goldman et al. | 340/172.5 |
| 3,356,836 | 12/1967 | Stenby | 179/1 SM X |
| 3,398,241 | 8/1968 | Lee | 179/1 SM |
| 3,566,365 | 2/1971 | Rawson et al. | 340/172.5 |
| 3,566,370 | 2/1971 | Worthington, Jr. et al. | 340/172.5 |
| 3,588,353 | 6/1971 | Martin | 179/1 SM |
| 3,641,496 | 2/1972 | Slavin | 179/1 SM X |
| 3,654,708 | 4/1972 | Brudner | 340/172.5 X |
| 3,679,875 | 7/1972 | Rawson et al. | 340/149 R |
| 3,681,756 | 8/1972 | Burkhard et al. | 340/172.5 |
| 3,686,637 | 8/1972 | Zachar et al. | 340/172.5 |
| 3,688,271 | 8/1972 | Rouse | 340/172.5 |
| 3,727,190 | 4/1973 | Vogelman et al. | 340/172.5 |
| 3,737,863 | 6/1973 | Rowland et al. | 340/172.5 |
| 3,740,725 | 6/1973 | Fletcher | 340/172.5 |
| 3,744,030 | 7/1973 | Kuljian | 340/172.5 |
| 3,747,069 | 7/1973 | Hershberg | 340/172.5 |
| 3,775,756 | 11/1973 | Balser | 340/172.5 |
| 3,778,774 | 12/1973 | Philipps et al. | 340/172.5 |
| 3,810,106 | 5/1974 | Nadler et al. | 340/172.5 |
| 3,878,514 | 4/1975 | Faber | 340/172.5 |

OTHER PUBLICATIONS

Buchholz, W., "Computer Controlled Audio Output," IBM Technical Disclosure Bulletin, vol. 3, No. 5, Oct. 1960, p. 60.

*Primary Examiner*—Raulfe B. Zache

[57] ABSTRACT

A system for operator interaction is provided using a stored program digital data processor and an audio message sub-system to process digital information and to provide audio messages for operator interaction. The system utilizes a digital data processor to execute program routines to process digital information and to communicate with an operator using audio messages. Digital message information is stored in a digital memory. The digital message information is accessed in response to operator generated signals to provide audio messages, in contrast to the prior art visual messages using displays and printers.

31 Claims, 11 Drawing Figures

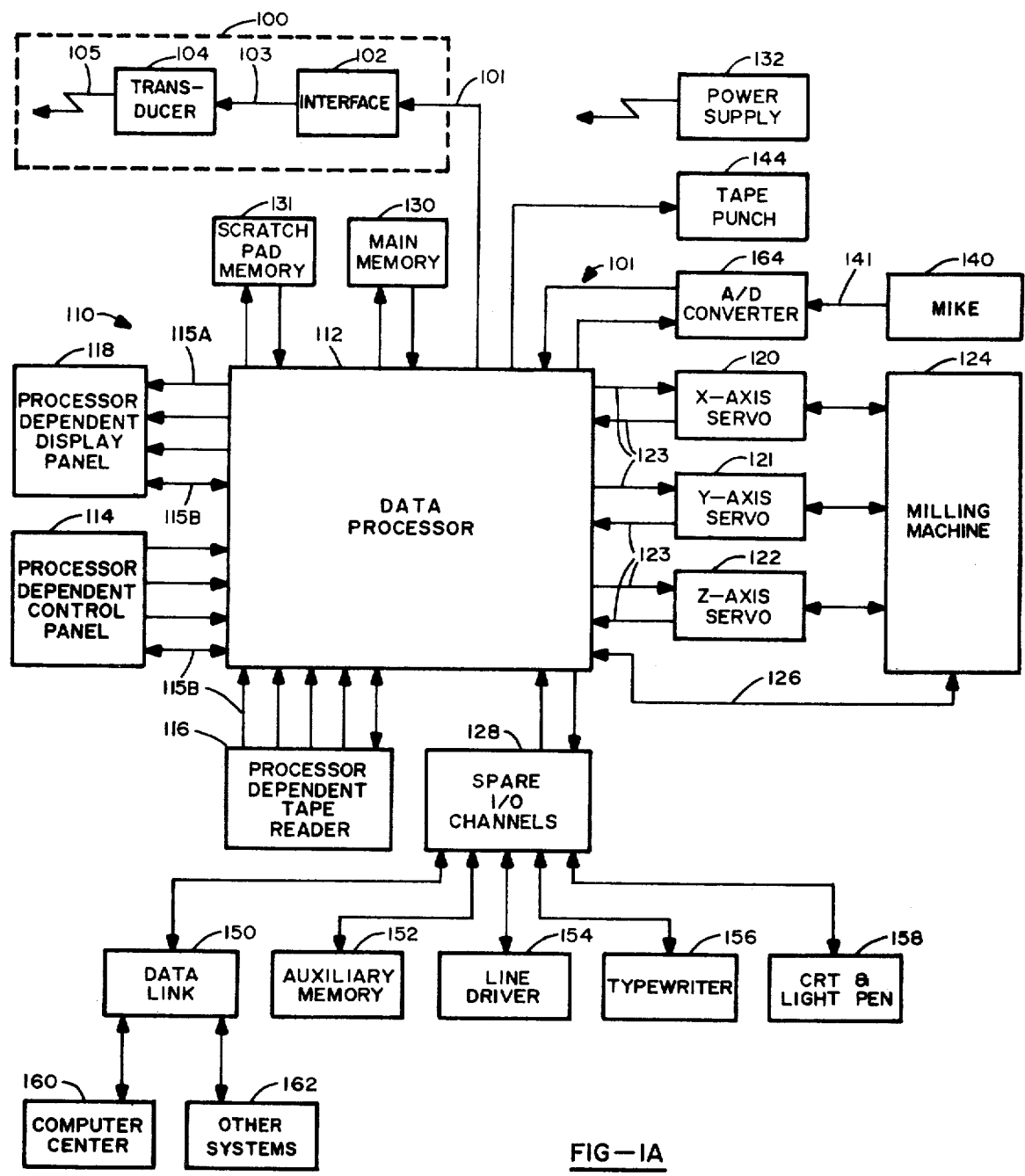
FIG—1A
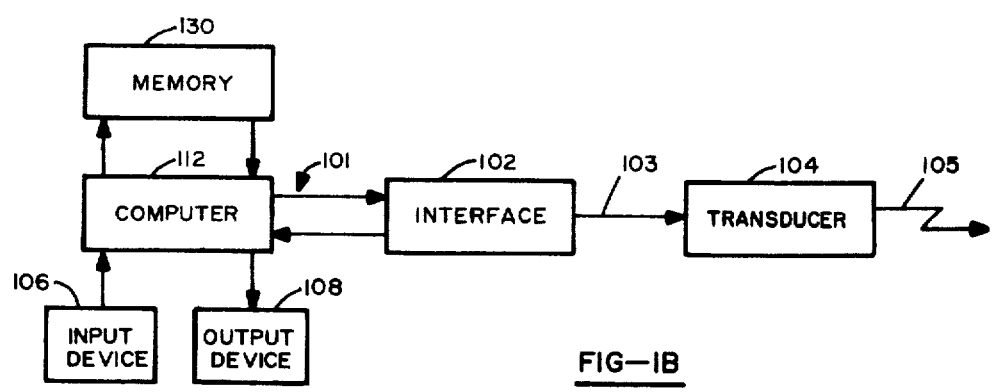
FIG—1B

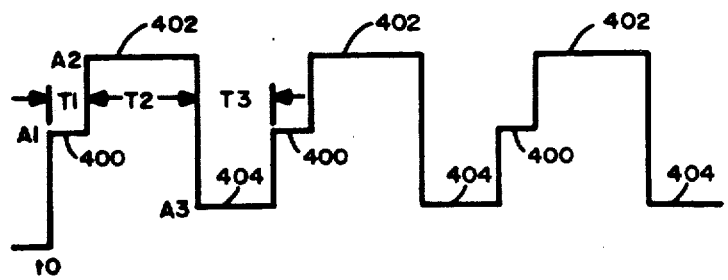
FIG-4A
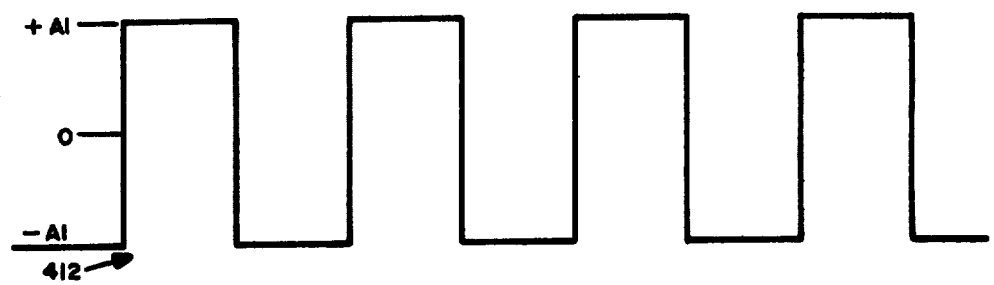
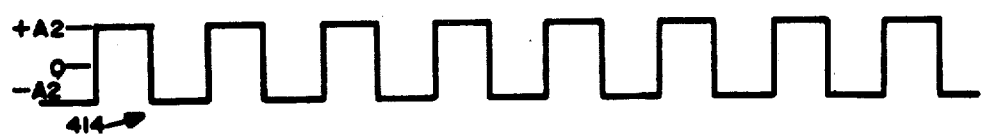
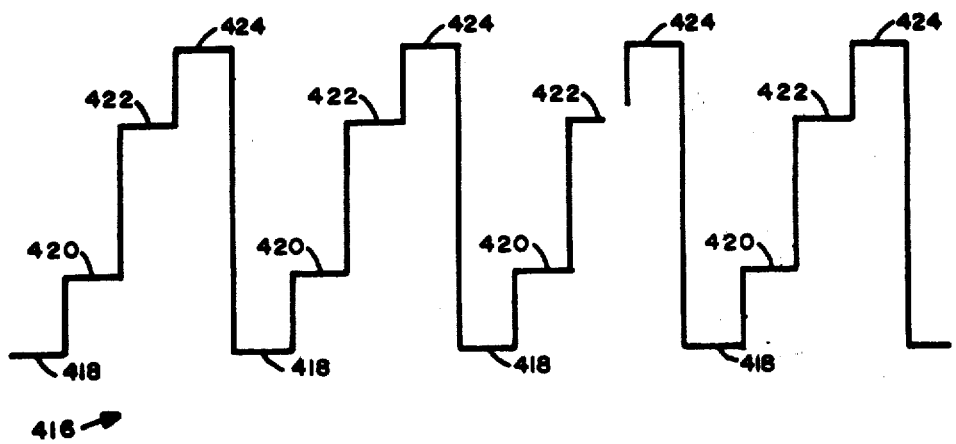
FIG-4B

APPARATUS AND METHOD FOR PROVIDING INTERACTIVE AUDIO COMMUNICATION

CROSS REFERENCE TO RELATED APPLICATIONS

This application is a continuation in part of copending patent applications 1. FACTORED DATA PROCESSING SYSTEM FOR DEDICATED APPLICATIONS Ser. No. 101,881 filed on Dec. 28, 1970 by Gilbert P. Hyatt;

2. CONTROL SYSTEM AND METHOD Ser. No. 134,958 filed on Apr. 19, 1971 by Gilbert P. Hyatt;

3. CONTROL APPARATUS Ser. No. 135,040 filed on Apr. 19, 1971 by Gilbert P. Hyatt;

4. COMPUTERIZED NUMERICAL CONTROL SYSTEM FOR PARTS PROGRAM CHECKOUT, EDITING, AND EXECUTION Ser. No. 230,872 filed on Mar. 1, 1972 by Gilbert P. Hyatt;

5. DATA PROCESSING SYSTEM HAVING A STORED PROGRAM COMPUTER DEDICATED TO THE NUMERICAL CONTROL OF A MACHINE Ser. No. 232,459 filed on Mar. 7, 1972 by Gilbert P. Hyatt;

6. APPARATUS AND METHOD FOR REAL TIME MACHINE CONTROL WITH A STORED PROGRAM DATA PROCESSER Ser. No. 246,867 filed on Apr. 24, 1972 by Gilbert P. Hyatt;

7. COMPUTERIZED SYSTEM FOR OPERATOR INTERACTION Ser. No. 288,247 filed on Sept. 11, 1972 by Gilbert P. Hyatt; and 8. APPARATUS AND METHOD FOR PRODUCING HIGH REGISTRATION PHOTO-MASKS Ser. No. 229,213 filed on Apr. 13, 1972 by Gilbert P. Hyatt now U.S. Pat. No. 3,820,894 issued on June 28, 1974;

9. STORED PROGRAM DATA PROCESSING SYSTEM FOR DIRECT CONTROL OF A MACHINE IN REAL TIME WITH DISCRETE SIGNALS Ser. No. 291,394 filed on Sept. 22, 1972 by Gilbert P. Hyatt;

10. DEDICATED COMPUTER SYSTEM FOR REAL TIME PATH CONTROL Ser. No. 302,771 filed on Nov. 1, 1972 by Gilbert P. Hyatt;

and is further related to concurrently filed patent application

11. ELECTRONIC CALCULATOR SYSTEM HAVING AUDIO MESSAGES FOR OPERATOR INTERACTION Ser. No. 325,941 filed on Jan. 22, 1973 by Gilbert P. Hyatt; and is still further related to copending patent applications 12. INTERACTIVE CONTROL SYSTEM Ser. No. 101,449 filed on Dec. 28, 1970 by Lee, Cole, Hirsch, Hyatt, and Wimmer now abandoned in favor of a continuing application; and 13. ADAPTIVE ILLUMINATION SOURCE INTENSITY CONTROL DEVICE Ser. No. 152,105 filed on June 11, 1971 by Lee, Wimmer, and Hyatt now U.S. Pat. No. 3,738,242 issued on June 12, 1973; wherein these copending patent applications are incorporated by reference as if fully set forth at length herein.

TABLE OF CONTENTS

TITLE OF SECTION
ABSTRACT OF DISCLOSURE
CROSS REFERENCE TO RELATED APPLICATIONS
BACKGROUND OF INVENTION
   FIELD OF THE INVENTION
   DESCRIPTION OF THE PRIOR ART
SUMMARY OF THE INVENTION
BRIEF DESCRIPTION OF THE DRAWINGS
DETAILED DESCRIPTION OF THE INVENTION
   AUDIONIC PROGRAM OPERATIONS
   AUDIONIC PROGRAM GENERATION
   ELEMENTAL CONVERTER OPERATION
   APPLICATIONS
      AUDIONIC CALCULATOR
      AUDIONIC CLOCK
      AUDIONIC TYPEWRITER
      AUDIONIC CASH REGISTER
      MULTI-TERMINAL SYSTEM
      VEHICULAR ANNUNCIATOR
      AUDIONIC MEDICAL TESTOR
      AUDIONIC DATA CONCENTRATOR
      AUDIONIC MUSICAL INSTRUMENTS
      AUDIONIC MONITOR
SCOPE AND DEFINITIONS
CLAIMS

BACKGROUND OF THE INVENTION

1. Field of the Invention

This invention relates to audio reply and message systems for operator interaction.

2. Description of the Prior Art

Audio reply systems have taken the form of tape recorders, phonograph records, and other well known electromechanical devices. Speech is recorded on a medium such as a magnetic tape, then played back as required to provide the audio message.

Automatic playback devices are known in the prior art such as with telephone answering systems that answer with recorded instructions on a first magnetic tape, then record a telephone message on a second magnetic tape. These electro-mechanical systems are typically bulky, unreliable, and inflexible; which characteristics are inherent in electro-mechanical devices. Also, these prior art arrangements only provide sequential access for generating fixed messages and do not provide the capability for general message buildup. Therefore, multitudes of potential applications have not been feasible in the prior art due to the limitations of this equipment.

Electronic musical instruments such as electronic organs are known in the prior art. Although these instruments do not provide speech messages, they are exemplary of one type of prior art arrangement. These instruments provide for the selection of oscillators and filters, where the oscillators generate the desired tones and the filters shape and combine the waveforms to generate complex sounds. The oscillators and filters are analog devices, selected with operator switches and controls. These analog devices are limited in capability and do not easily lend themselves to monolithic processes.

SUMMARY OF THE INVENTION

The present invention provides an improved system for operator communication. In particular, a digital audionic system is presented for speech messages also known as speech replies. This arrangement has been found to be particularly advantageous in a system using digital data processing and, in particular, in dedicated systems using a stored program data processor.

Many prior art devices rely on visual displays for operator feedback such as a calculator and a clock. The operator must visually inspect the device to determine the conditon, state, or information to be provided; which can result in distracting the operator from other tasks. The audionic device of this invention provides an audionic or speech feedback message which can be received by the operator without distraction from visual tasks and with a minimum of operator effort.

An audionic calculator system exemplifies this invention, where an operator may be viewing a column of numbers and entering the numbers digitally through a keyboard without taking his vision from the column of numbers. In prior art calculators, the operator must view a display and will not be cognizant of errors in entering the numbers when not visually monitoring the feedback display. With the use of an audionic calculator, the system will reply with audio messages to define the information entered and the solutions without requiring the operator to take his vision from the column of numbers.

A clock system also exemplifies this invention, where an operator may desire time information when performing tasks such as driving a vehicle which involves concentrated visual attention. The operator may interrogate the audionic clock such as by depressing a switch to obtain an audio reply of the time without interrupting a continuous visual task.

The digital audionic system of this invention distinguishes over the prior art systems and provides advantages over those prior art systems. The digital arrangement for generating audio signals differs from the mechanical techniques such as used in the tape recorders and differs from the electronic analog techniques such as with oscillators and filters. The digital form of this invention has many advantages over the prior art arrangements including virtually unlimited flexibility to develop audionic messages and suitability for batch fabrication such as with integrated circuit processes.

The audionic system has been found to have particular advantages in portable devices because of the low power consumption and small size characteristics.

The audionic system can provide lower power consumption than is possible with prior art display systems. The audio reply may be intermittant reply with a single sequence of audio characters. This is contrasted to a continuous visual display required to insure operator acceptance of the displayed information. In addition, the efficient conversion of electrical to audio energy can be achieved with a miniature high efficiency transducer. Therefore, average power drain can be extremely low.

The audionic system can be of small size and simplified packaging when compared to a bank of display characters. A single miniature audio transducer can be made extremely small because there is no inherent human factors requirement for size such as for display devices in which the operator must be able to visually resolve the displayed characters. Also, package configuration is not critical with an audionic device because the orientation relative to the operator is not critical, where audio energy can be interpreted around corners or from inside a pocket of a garment being worn by an operator and is not restricted to "line of sight" as with visual displays.

The audionic device can be a batch fabricated device where the same manufacturing process may be used for virtually all parts of the device with the possible exception of a miniature transducer. The monolithic technology can be used to batch fabricate a processor, an audionic memory, and an audionic D/A converter on a single integrated circuit chip or array of integrated circuit chips providing what is defined herein as a monolithic audionic system.

The audionic clock and the audionic calculator each can be implemented as illustrated for the generalized audionic device in FIGS. 1A and 1B. Various peripherals or extremities may be added or eliminated as required for the particular application as described in the referenced application Ser. No. 101,881. For example, the keyboard or tape reader may be used to load information into the audionic clock system such as for initial time setting. After loading, the clock does not require a keyboard. Therefore, the keyboard can be implemented as a plug-in device and need not be an integral part of the clock system.

The particular embodiments discussed herein indicate the flexibility of the audionic device which can be used in a wide range of systems including vehicles such as an automobile, inhabited structures including a home and an office, equipment including a typewriter and an oscilloscope, and other such uses. In general, the audionic device can be used for most applications that require a system to interact with an operator.

In this invention, digital audionic signals representative of speech are stored and available for speech message generation under control of a digital device which may be a digital computer. The digital audionic signals can be accessed in a random access manner. This permits the digital device to select various digital audionic signals in a programmable sequence and to build up a more complex speech pattern.

An audionic system is implemented with an audionic memory for storing audionic information, a digital data processor which may be a stored program digital computer for processing the audionic information, and an audio transducer for converting the digital audionic information into audionic replies. The transducer may include a digital-to-analog (D/A) converter to convert the digital signals to analog signals and a speaker or earphone to convert these analog signals to sound waves. The digital processing may include retrieval of a sequence of stored audionic samples or may involve computations to generate many samples from optimized information.

In an illustrated embodiment, the audionic system includes a stored program digital data processor which executes program routines to derive digital samples that are used to make-up the speech message. A D/A converter is used to convert the audio samples to analog signals which are amplified and used to drive an audio transducer such as a speaker or ear phone.

An object of this invention is to provide a practical audionic system.

A further object of this invention is to provide an audionic calculator system.

A further object of this invention is to provide an audionic clock system.

A further object of this invention is to provide a concentrated speech communication system.

Still another object of this invention is to provide an audionic medical testor.

The foregoing and other objects, features, and advantages of this invention will be apparent from the following detailed description of preferred embodiments of this invention, as illustrated in the accompanying drawings.

BRIEF DESCRIPTION OF THE DRAWINGS

A better understanding of the invention may be had from a consideration of the following detailed description taken in conjunction with the following drawings, in which:

FIG. 1 is a block diagram of the system comprising FIG. 1A showing a general purpose data processing system having audio response capability and FIG. 1B showing the audio response portion of the system of FIG. 1A.

FIG. 4 illustrates audionic signals comprising FIG. 4A showing a first waveform to exemplify audio signal buildup and FIG. 4B showing a second waveform to exemplify superposition of waveforms.

FIGS. 1A and 2 of this application are generally the same as the corresponding figures in the previously referenced applications, Computerized System For Operator Interaction Ser. No. 288,247 and Factored Data Processing System for Dedicated Applications Ser. No. 101,881 with changes to make those figures compatible with the form and substance of the instant application.

Figure 2:
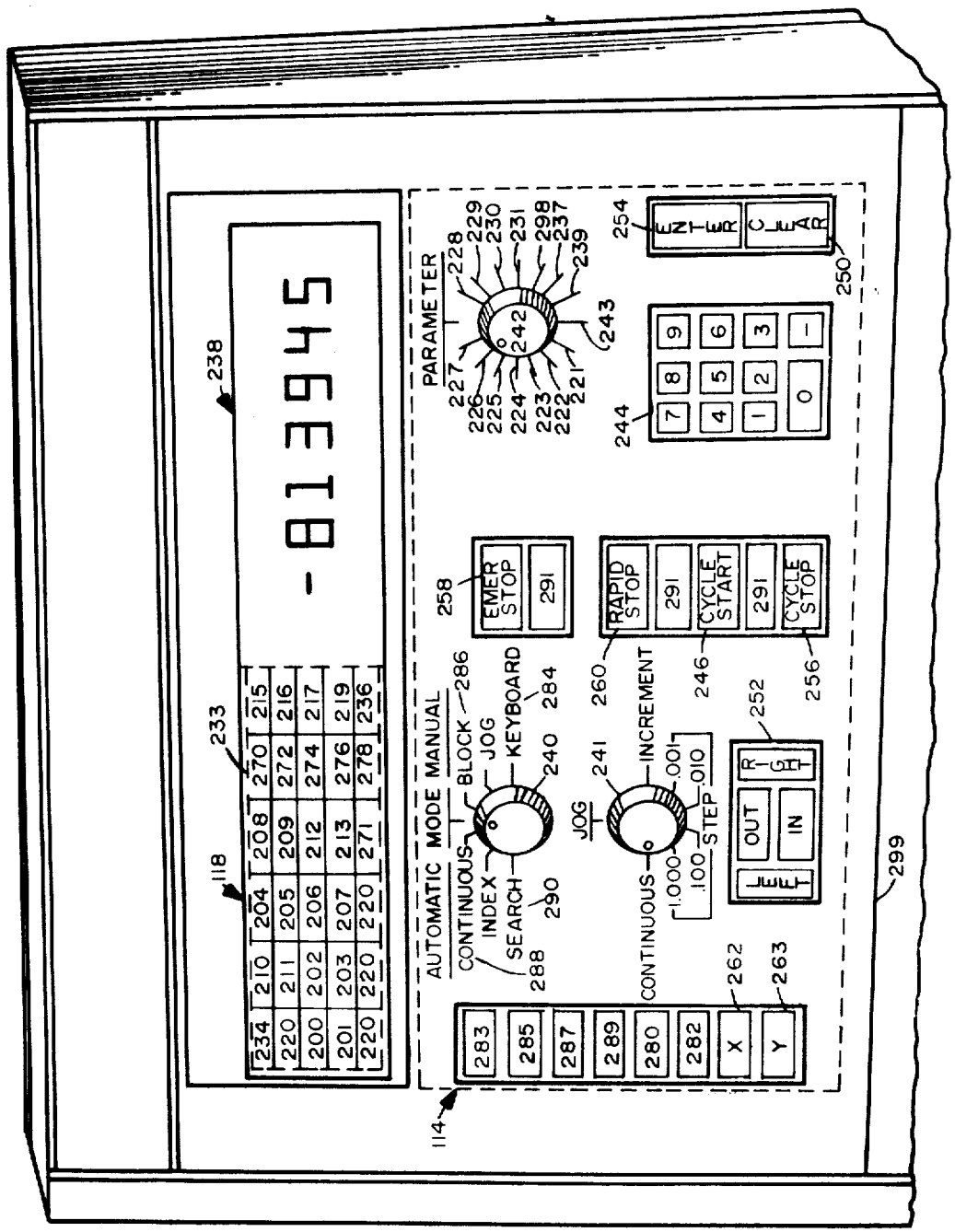
FIG. 2 is a diagram of the control and display panel.

By way of introduction of the illustrated embodiment, the components shown in FIGS. 1 through 7 of the drawings have been assigned general reference numerals and a brief description of such components is given in the following description. The components in each figure have in general been assigned three digit reference numerals wherein the hundreds digit of the reference numerals corresponds to the figure number. For example, the components in FIGS. 1A and 1B have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

The audionic system of this invention can take any of a number of possible forms. A preferred embodiment of the present invention is shown in FIGS. 1A and 1B will be described in detail hereafter.

This application is a continuation-in-part of the previously referenced applications Ser. No. 101,881 and Ser. No. 288,247 and relates more specifically to an audionic message system which may be provided by applying the general teachings of the parent applications to the specific context of this audionic system for operator interaction.

The system of this invention is exemplified by the system disclosed in the referenced copending applications and shown in FIG. 1A. As discussed in the parent applications; the system peripherals and extremities may be changed to meet the requirements of the particular application while still exemplifying the teachings of that invention. For example, the data processing system 110 has been shown as a numerical control system for controlling a milling machine 124, where input and output peripheral subsystems have been described which are suitable for performing this desired control function in the previously referenced application Ser. No. 101,881. However, those skilled in the art will readily recognize that the numerical control system is merely illustrative of the present invention and the principles of that invention are equally applicable to other systems such as audionic systems described herein in which different forms of input and output peripheral sybsystems might be used to perform the particular task of such other systems. An audionic subsystem is shown in FIG. 1B to illustrate the audionic application of the system of this invention.

In the preferred embodiment, the system of this invention is a dedicated data processing system; where the data processor 112 is a stored program data processor committed to one or more prime tasks. As shown in FIGS. 1A and 1B, the data processor 112 performs a system prime task under program control such as the numerical control of a machine 124 or such as calculator processing in conjunction with an operator through control panel 114 and display panel 118. In the system of this invention, an audionic subsystem 100 including audionic interface 102 and transducer 104 is provided for operator communication, where the peripherals not required for this audionic system such as the machine 124 of the numerical control application are not included in the system.

The data processor 112 may also perform system subtasks such as processor coaction for operation of a peripheral as discussed for the factored or integrated data processing system of the parent applications and as discussed for the analog-to-digital (A/D) converter hereafter.

It is within the scope of this invention to provide a display panel 118 as an auxiliary operator interface in the audionic system and may be refreshed such as under computer program control as described in detail in the referenced applications. It is still further within the scope of this invention to provide computer processing of switch rudimentary signals as discussed in the referenced applications.

The data processor 112 operates under control of a program stored in the main memory 130 and may operate in conjunction with a scratch pad memory 131. As discussed in the parent applications, the preferred embodiment of this data processor is as a monolithic data processor, where the main memory 130 is an integrated circuit read only memory and the scratch pad or intermediate memory 131 is an integrated circuit alterable memory.

Figure 3:
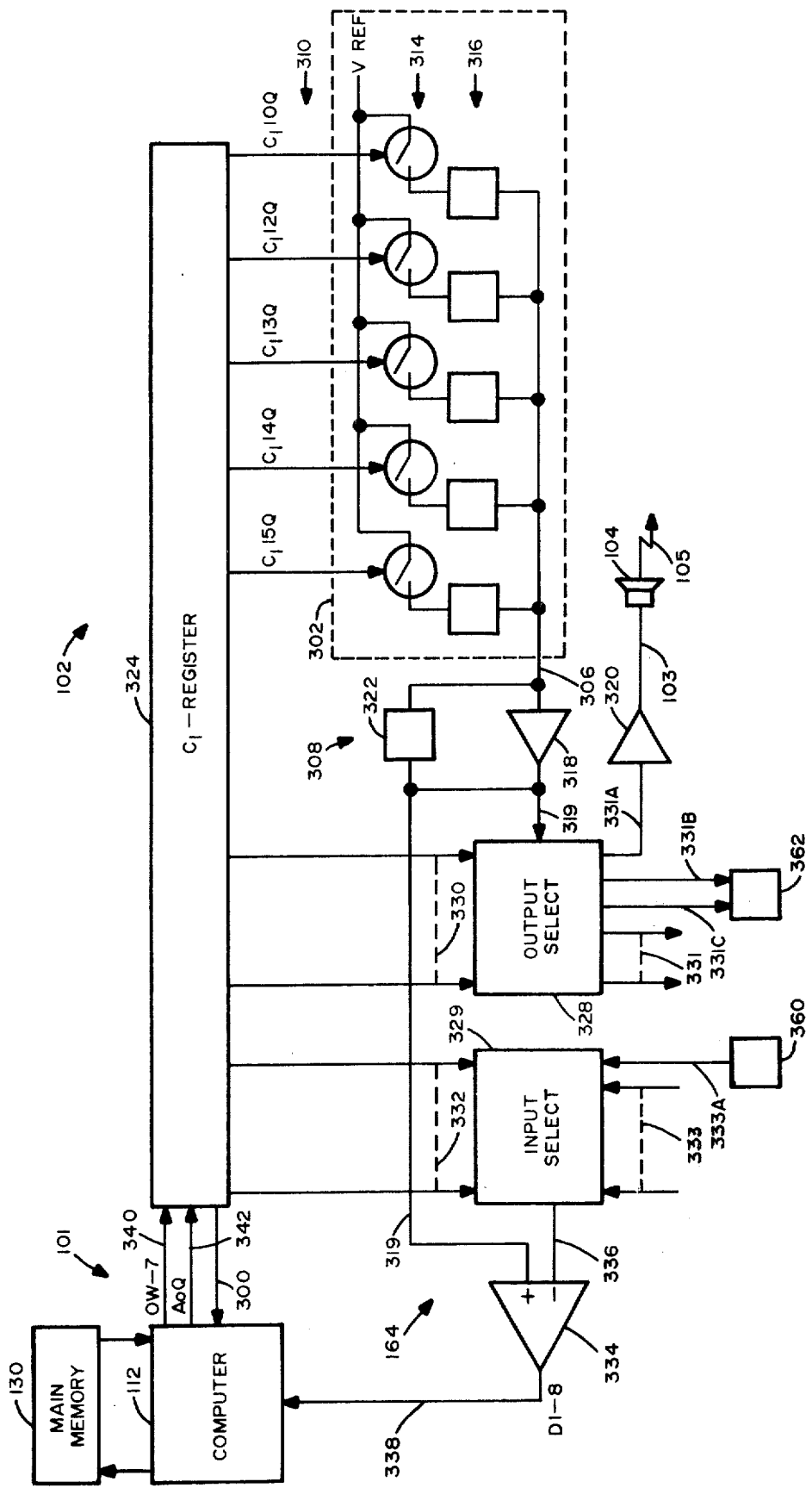
FIG. 3 is a block diagram and schematic diagram of the converter subsystem.

The data processor 112 operates in conjunction with a plurality of peripherals which include an audionic subsystem which is shown in FIGS. 1B and 3 and which may include an operator panel such as the control panel 114 or display panel 118 or both, which are shown in more detail in FIG. 2; a tap reader 116 which may be a punched tape reader; a data link 150 to communicate with a computer center 160 and other systems 162; an auxiliary memory 152 such as a rotating memory or other well known memory; line drivers and receivers 154 to communicate with various other subsystems; a typewriter 156; a CRT display and light pen 158; and other such subsystems.

A reduced block diagram is shown in FIG. 1B where the system of FIG. 1A is reduced to the specific form of an audionic system. Processor 112 is responsive to information stored in memory 130 to provide audionic messages 101 to audionic interface 102 to control transducer 104 with signals 103. The transducer provides audio (sound) signals 105 in response to electrical control signals 103. The data processor 112 is a stored program data processor in a preferred embodiment but may be a special purpose logic device in other embodiments. The interface 102 accepts digital command signals 101 and generates transducer control signals 103. In a preferred embodiment, audionic interface 102 includes a D/A converter and amplifier to drive transducer 104 with analog control signals 103. A preferred embodiment of a D/A converter 302 is discussed in detail hereafter. Other embodiments will become obvious to those skilled in the art. In other embodiments, audionic interface 102 can be implemented with other control arrangements, where control signals 103 may be digital drive signals or other such signals. It will become obvious to those skilled in the art that other control or signal processing arrangements can be provided for interface 102 that will be responsive to digital command signals to provide the speech messages.

The audionic transducer 104 may be a well known speaker or earphone for generating sound waves in an air medium or may be another type of transducer that impresses audionic signals on other medium such as in water or on a bone. Therefore, audionic signals may include sound waves, speech waves, vibration, and other such signals. Various input subsystems 106 and output subsystems 108 may also be included in the audionic system as required by the application.

As shown in FIG. 3, a parallel output register 324 receives digital signals 101 from data processor 112 to excite D/A converter 302. Register 324 is exemplified by the $C_I$ Register shown in FIGS. 13 and 15 of the referenced application Ser. No. 101,881. The digital signals $C_{115}Q$ through $C_{110}Q$ select analog switches 314, which may be FET switches or other well known circuits, to selectively excite the resistor ladder 316 to sum the signals from switches 314 to generate analog signal 306.

Amplifier 318 and power amplifier 320 will buffer, filter, and amplify analog signal 306 to generate signal 103 to drive the sound transducer 104. Other circuit arrangements will become obvious to those skilled in the art.

Operation of the audionic device is generally described with a constant sample rate or a constant period between sample updates. An added degree of flexibility and optimization is achieved with a variable sample rate or update period. As will be discussed hereafter in conjunction with the waveform of FIG. 4A and the program flow chart of FIG. 5B, a programmable period T is provided to decrease the required number of samples, to increase audio fidelity, and to generally increase the flexibility of the audionic system.

The operation of this invention will be better understood with a simple example. A repetitive square wave waveform is illustrated in FIG. 4A. This waveform is characterized by amplitudes $A_1$ 400, $A_2$ 402, and $A_3$ 404 with corresponding periods $T_1$, $T_2$, and $T_3$. If this waveform were properly amplified and used to excite a speaker transducer, a characteristic sound would be generated.

A preferred embodiment of the apparatus to generate this sound is shown in FIG. 3. The digital data processor 112 accesses digital sound information from a digital audionic memory such as the main memory 130 of the data processor 112 or an auxiliary memory 152. The digital memory may be a core memory, an integrated circuit read only memory, a rotating memory such as a drum or disc, or other such memory In a preferred embodiment, an integrated circuit read only memory is used. The digital signals 101 are transferred to a D/A converter 302 which converts the digital signals 101 to analog sound signals 306. These analog sound signal 306 are processed with an audio signal processor 308 which may include amplifiers 318, 320; filters 322; and other audio signal processor devices. The processed analog sound signals 103 are used to drive a sound transducer 104 to generate audiable sound 105. This sound must be of the proper amplitude and frequency to be detected in a useful form at the destination, which is typically the human ear.

An audionic system can provide a plurality of time shared outputs. As shown in FIG. 3, the computer 112 can sequentially select a plurality of output channels 331 with addresses 330 to select logic 328. Each output channel 331 can be an audionic channel as illustrated for channel 331A with amplifier 320 and transducer 104, where amplifier 320 can provide a sample-and-hold capability to enhance time share operation. This multiple output system can be used for a system having a plurality of operators such as an airplane with a flight crew, an audionic testor for a plurality of patients being tested, or other such applications.

Human factor consideration may be related to size such as with visual displays that must be of a size sufficient for an operator to conveniently resolve the visual message. Therefore, the degree of miniaturization of a system with a visual display has an inherent limitation. The audionic system of this invention has virtually no miniaturization limitation related to human factors considerations, where the audionic message may be interpreted by an operator with little consideration for physical dimensions such as will become obvious to those skilled in the art.

Because the audionic system has no practical size requirement such as discussed for human factor requirements for visual displays, fuller advantage may be taken of monolithic technology and smaller less expensive systems may be configured with audionic devices than with display devices.

Improved miniaturization characteristics can be achieved with the digital audionic system of this invention over the analog filter and mechanical prior art arrangements, where the digital audionic arrangement is more adaptable to monolithic LSI implementation.

Display systems require adaquate structure to mount the display elements in an orientation adequate for operator viewing. The line-of-sight viewing requirements of visual displays pose further requirements for structure and for location and orientation of the display. The audionic system is not constrained by the mounting of elements nor line-of-sight requirements. For example, an audionic system can be located in a pocket, remote from the operator's area of attention, and other such degrees of freedom which will permit optimization of configuration and useage.

The audionic system of this invention has particular advantages when constructed as a monolithic audionic system. This monolithic audionic system is intended to mean a system where the audionic portions are constructed mostly of integrated circuits with well known monolithic or integrated circuit processes. All parts of the audionic device, possibly with the exception of the audionic transducer 104, lend themselves to the monolithic process. For example, the monolithic data processor 112 and monolithic read only memory 130 are discussed in the referenced application Ser. No. 101,881, and may use a monolithic D/A converter 302 and monolithic amplifier 318. These monolithic elements may be manufactured on a single integrated circuit chip or on a plurality of integrated circuits chips. To provide a monolithic audionic system, it is not necessary that all of these elements be monolithic elements, but it is preferred that broad use be made of monolithic elements.

A particularly efficient arrangement uses the well known large scale integration (LSI) processes and technology to construct the monolithic audionic devices. Such LSI processes may be MOS-FET or bipolar integrated circuit processes.

Human factors considerations associated with visual and audio communication are heavily weighted in favor of audio communication. An operator must make a conscious effort to view a visual display, distracting attention from other tasks. In contrast, an operator can receive an audio message without significant distraction of attention. Generally, a visual message must be continually presented to assure that it is available when viewed by an operator, but an audio message is typically intermittant in nature and accepted by an operator when presented. An example is presented herein for an audionic calculator, where the operator can accept a single audionic message independent of other operator activity even though the message is provided only once and at a time when the operator is concentrating on other activities. In contrast, it will be obvious that a visual display must be continuously generated to insure that the operator receives the message at an arbitrary time at which the operator may view the display. The audionic message is an active message that commands operator attention and the visual message is a passive message that awaits operator attention.

Because of the active, intermittant nature of audio messages and the passive, continuous nature of visual messages; a lower power audionic system may be arranged which dissipates substantially less power than a comparable visual display system. This low power arrangement for the audionic system can be related to the generation of audionic messages intermittently when required rather than continuously repeating the message. It has been found that an intermittant audionic message is actually preferred because a continually repeated message can be displeasing to an operator; yet an intermittant message such as generated upon operator interrogation is satisfactory and usually most desireable. It has been found that the duty cycle of an audionic message may be less than 1% of the operating time for many applications. With the audionic clock, the duty cycle may be only 0.01% based upon approximately five interrogations per day. Therefore, it can be appreciated that the average power dissipation can be extremely low for intermittant operation.

With the intermittant operation consideration discussed above, it has been found that power dissipation can be further reduced by minimizing the standby power of the audionic portions of the system such as the D/A converter 302 and amplifiers 318, 320. This can be accomplished with an embodiment using a circuit design that has low standby power dissipation such as when biased to cutoff. Another embodiment uses a design that incorporates a switch to turn off the power supplied to selected audionic elements. This power switch may be controlled by processor 112, may be an interrogation switch actuated by the operator, or other devices that will become obvious to those skilled in the art.

The audionic memory is presented herein as a portion of main memory 130, which is a monolithic read only memory in a preferred embodiment. It will become obvious to those skilled in the art that other type memory devices may be used to store audionic information. Well known flip-flop memories such as shift registers and RAM memories can store audionic information. Also magnetic memories such as the well known core memories and rotating memories (drum and disc memories) can also be used to store audionic information. Special memory arrangements such as the "bubble memory" may also be used to store audionic information This stored audionic information is intended to mean the information used to construct the audionic messages such as speech samples; amplitude, time, and frequency information; subroutines to construct messages; and other such information.

The economy of the audionic device can be defined with an example. Assuming that a 1 KHz frequency response and a 5 bit (1 part in 32) resolution is acceptable for speech fidelity, then a sample rate of twice this frequency, 2 KHz may be used. This relates to a data rate of:

(2,000 samples/second) (5 bits/sample)=10,000 bits/second Also assuming that speech averages one word per half second and that large scale integration (LSI) read only memory (ROM) costs 0.1 cent per bit, then the cost per word is:

(10,000 bits/second) (½ second/word(($10$^{-3}$/-bit)=5/word An audionic system such as a calculator system or clock system would require approximately 20 words including the ten numbers 0–9 and various control words. At the rate of $5/word, an 20 word audionic system would require $100 for the LSI-ROM audionic memory.

The above example was based upon storing each sample in sequential fashion. Significant economies can be achieved by using audionic optimization techniques such as discussed herein. It is estimated that the memory requirement can be reduced by 75% with the use of audionic optimization, yielding an LSI-ROM audionic memory costing only $25 for the system in the above example.

Another consideration associated with the audionic optimization arrangement is that the frequency response can be increased substantially without greatly increasing the audionic memory requirement. It is estimated that the frequency response can be increased by 500%, from 1 KHz to 5 KHz, with only a 50% increase in audionic memory cost, from $25 to $37.50 when the optimized subroutine arrangement is used as compared to merely the storage of samples for each sample period.

The system of this invention may be further characterized as a digital audionic system, where the digital devices build-up audionic messages in the digital domain using various digitally generated frequency and amplitude components. This digital audionic system is more than a programmable control for audio oscillators and filters, but eliminates the need for such devices with digital operations. This system may be still further characterized as an interactive audionic system, where the audionic responses are generated in response to and in an interactive manner with an operator operating a device. As an example, the operator depresses calculator keys and receives audionic messages as continuous interactive feedback for proper operation.

The terms computer and data processor used herein are intended to include a stored program data processor. The preferred embodiment of a stored program data processor is presented in the previously referenced application Ser. No. 101,881. It will be obvious that a stored program data processor is unique in that the operation of such a data processor is determined by a stored program. This stored program may be contained in a uniquely definable main memory as shown schematically in FIGS. 1A and 1B. This block diagram representation is in accordance with prior art memories, such as core memories or rotating memories. In the preferred embodiment of this invention the main memory 130 is an integrated circuit read only memory. This arrangement is unique because the integrated circuit processes required to manufacture the main memory 130 may be the same as the integrated circuit processes required to manufacture the data processor, thereby permitting an integrated monolithic data processor and stored program memory to be fabricated together. A well defined boundary between processor means and stored program memory means may not exist in a factored data processor subsystem. Therefore, a more generalized data processor must be visualized wherein the stored program may be an integral part of the data processor. Similarly, because of the low cost and flexibility of this integrated circuit read only memory, part of the data processor logic may be implemented in this read only memory just as part of the extremity logic is implemented in this read only memory. One characterization of the stored program of this monolithic data processor is a repetitive array of memory elements that defines the operation of the data processor which constitutes a stored program. This main memory contains a group of digital conditions or instructions accessed sequentially from the main memory and executed in the data processor to perform data processor tasks such as computational and control tasks. The data processor is responsive to program routines or groups of these instructions to perform data processor operations and system operations.

A preferred embodiment of the audionic system of this invention is implemented with integrated circuit techniques which are well known to those skilled in the integrated circuit art. Integrated circuits are monolithic devices that are fabricated in the form of individual "chips." A monolithic arrangement may be fabricated on a single chip such as with the well known LSI circuits or a plurality of chips that are interconnected together. A read only memory integrated circuit may be arranged as a monolithic array of read only memory bits. An alterable memory integrated circuit may be arranged as a monolithic array of alterable memory bits. Because of the common integrated circuit processes, various logic, circuit, and memory arrangements may be integrated together; thereby eliminating conventional prior art partitioning boundaries. Other characteristics of monolithic integrated circuit technology may be used to advantage to implement this invention, as will become obvious to those skilled in the art.

AUDIONIC PROGRAM OPERATIONS

The data processor 112 executes the executive program to control all program operations and provide for time sharing with program routines. The data processor detects inputs and conditions with the executive program, then transfers to the various program subroutines necessary to perform the computations and generate the outputs. The data processor can execute programs on a time shared basis by branching out of subroutines such as on a sequential, interrupt, or priority basis as is well known in the art. For simplicity of description, relatively complex program operations such as time sharing operations are not shown in the flow diagrams in FIGS. 5A–5D and 6; but will become obvious to those skilled in the art. The data processor stored program operation will be described hereafter. The data processor 112 is responsive to a stored program contained in main memory 130 to provide this processing capability. Operation of the data processor 112 is controlled by the executive routine 500 where the executive routine accesses the subroutines to be executed, sets the priority of these subroutines, defines the timing, and other such well-known operations. The executive routine 500 will control the data processor to periodically test the real time parameter in operation 502 to determine if it is time to enter one of the real time subroutines; where the real time parameter may be derived from a real time clock, a program timer in the executive routine 500, or other well known means and methods for deriving this parameter. In one embodiment, this timer may be implicit in the stored program, where a transfer to the appropriate subroutine is provided after a certain number of instructions have been executed, thereby implying the required real time period. If the required periods have not expired, the data processor will return to the executive routine along path 504. If one of the required periods has expired to within the required tolerance, the data processor will preserve the return address and other parameters for reentry to the executive routine 500 and perform other required housekeeping functions in operation 508, then the data processor will enter the subroutine 510 along path 509 to perform the required program operations. The data processor will exit the subroutine by fetching the return address, preserved in operation 508, then transferring back to the executive routine 500 along path 512.

Audionic signals carry information in the frequency and amplitude characteristics. These characteristics are determined primarily by the data processor 112 and to a minor extent by the other system devices 302, 308, and 104. The data processor 112 operates under program control to generate the required digital sound signals 101. A simple program flow diagram to provide digital sound signals is shown in FIG. 5B which corresponds to the digital sound signals shown in FIG. 4A. The program enters the subroutine along path 509 to operation 516 which sets up the initial conditions for the subroutine. One of these initial conditions is preloading the constant "three" into a storage location defined as $N_1$ to provide three iterations for three repetitive cycles of the waveform, shown repetitively in FIG. 4A. The computer then executes operation 518 by fetching the $A_1$ parameter and outputting this parameter to the D/A converter 302 to generate the $A_1$ amplitude 400. The computer 112 then executes operation 520 which provides a $T_1$ period time delay. The computer then executes operation 522 by fetching the $A_2$ parameter and outputting this parameter to the D/A converter 302 to generate the $A_1$ amplitude 402, followed by execution of operation 524 which provides a $T_2$ period time delay. The computer then executes operation 526 by fetching the $A_3$ parameter and outputting this parameter to the D/A converter 302 to generate the $A_3$ amplitude 404, followed by execution of operation 528 by providing a $T_3$ period time delay. The computer then executes operation 530 which decrements the N parameter to define the number of iterations through this subroutine which are still required for a total of three cycles of the waveform shown in FIG. 4A. The computer then tests the N parameter in operation 532. If the parameter is greater than zero, additional iterations are required to generate the total of three cycles of the waveform, so the program loops back along path 534 for additional cycles of the repetitve waveform. If the N parameter in operation 532 is equal to zero, then the three waveform cycles have been generated and the program branches along path 512 to exit the subroutine.

Complex audio waveforms may be considered to be the superposition of many frequency components with associated scale factors such as defined by well known mathematical methods typified by the Fourier series. The digital superposition of two squarewaves will now be described to exemplify the superposition arrangement for building-up audionic messages. More complex waveforms can be generated by using the teachings of this invention, which will now become obvious to those skilled in the art. For example, sine waves can be substituted for the squarewave of this example; complex phase, frequency, and amplitude combinations can be used; many different waveforms can be superimposed (not limited to two waveforms); and such other extensions of this technique.

As shown in FIG. 4B, waveform $A_2$ 414 will be superimposed on waveform $A_1$ 412 to generate waveform 416. The superimposed waveform is generated with a program shown in the program flow chart of FIG. 5C. In general, this program generates a component of the $A_1$ squarewave 412, then superimposes a component of the $A_2$ squarewave 414 on the $A_1$ squarewave 412. For illustrative purposes the example will be shown with waveform $A_2$ 414 exactly one half of the frequency of waveform $A_2$ 412. Also for simplicity, the program iterations will be shown synchronized to the iteration parameter (N).

The computer 112 enters the superposition subroutine along path 509 and initializes the cycle counter parameter N to eight for eight half cycle periods of the $A_1$ waveform 412 in operation 540. The computer then tests the N parameter in operation 541 to determine if the $A_1$ waveform 412 is on a negative or positive half cycle as determined by the N parameter being even or odd, respectively. For the first iteration N=8 and for each alternate iteration N is an even number; so the computer branches along path 542 and loads the $-A_1$ amplitude parameter into the A parameter storage location in operation 543. The computer then executes operation 546 by adding the A parameter which is now $-A_1$ to the $-A_2$ parameter and outputting the sum $(-A_1-A_2)$ to the audionic subsystem 100 to generate signal level 418. The computer then executes a time delay for the sample period in operation 547 and then executes operation 550 by adding the A parameter which is now $-A_1$ to the $+A_2$ parameter and outputting the sum $(-A_1+A_2)$ to the audionic subsystem 100 to generate signal level 420. The computer then executes a time delay for the sample period in operation 551 and then executes operation 554 by decrementing the N parameter, indicative of the completion of a negative $(-A_1)$ half cycle period of the $A_1$ waveform. The computer then tests the N parameter in operation 555. If N is not equal to zero, then the computer loops back to operation 541 along path 556. If N is equal to zero, then the computer exits the subroutine along path 512, indicative of eight half cycle periods of the $A_1$ waveform being generated. For the second iteration, the computer next tests the N parameter in operation 541 to determine if the $A_1$ waveform 412 is on a negative or positive half cycle. For the second iteration N=7 and for each alternate iteration N is an odd number; so the computer branches along path 544 and the $+A_1$ amplitude parameter is loaded into the A parameter storage location in operation 545. The computer then executes operation 546 by adding the A parameter which is now $+A_1$ to the $-A_2$ parameter and outputting the sum $(+A_1-A_2)$ to the audionic subsystem 100 to generate signal level 422. The computer then executes a time delay for the sample period in operation 547 and then executes operation 550 by adding the A parameter which is now $+A_1$ to the $+A_2$ parameter and outputting the sum $(+A_1+A_2)$ to the audionic subsystem 100 to generate signal level 424. The computer then executes operation 554 by decrementing the N parameter, indicative of the completion of a positive $(+A_a)$ half cycle period of the $A_1$ waveform. The computer then tests the N parameter in operation 555. If N is not equal to zero, then the computer loops back to operation 541 along path 556. If N is equal to zero, then the computer exits the subroutine along path 512, indicative of eight half cycle periods of the $A_1$ waveform being generated.

Figure 5C:
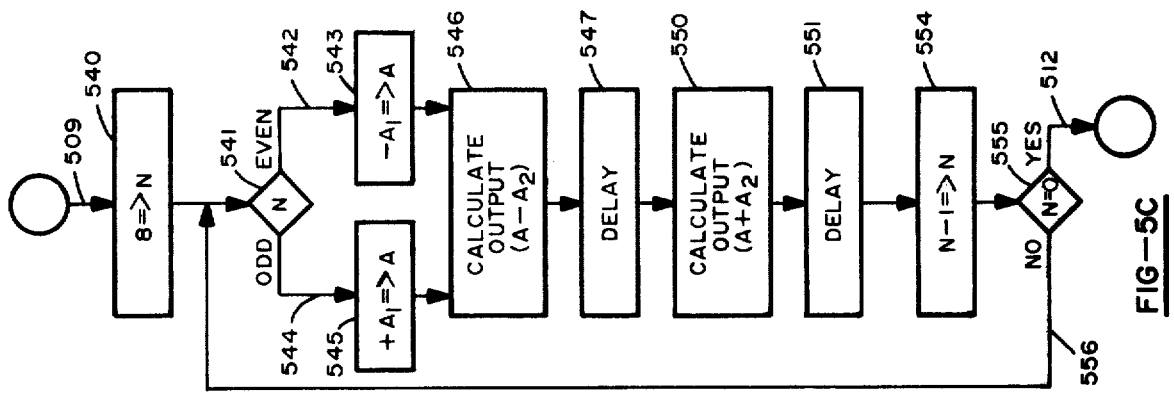
FIG. 5 shows program flow diagrams of audionic operations comprising FIG. 5A showing an executive routine, FIG. 5B showing a flow diagram related to generating the waveform of FIG. 4A, FIG. 5C showing a flow diagram related to generating the waveforms of FIG. 4B, and FIG. 5D showing a flow diagram related to signal buildup.
Figure 5B:
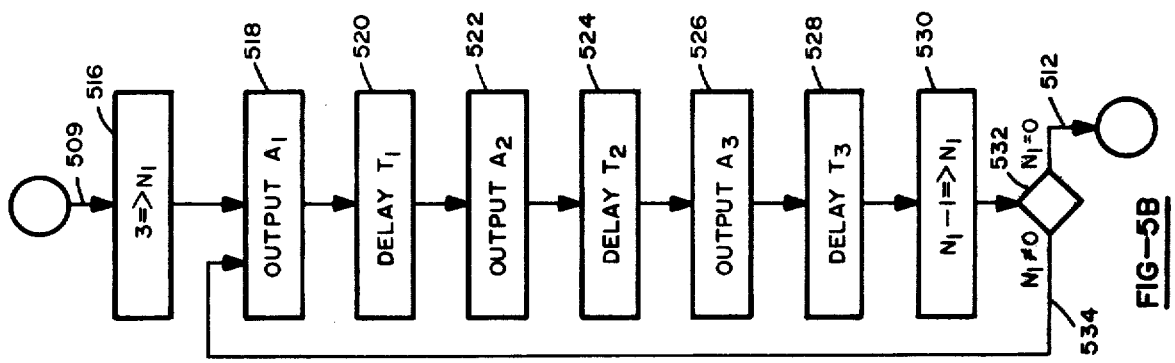
Figure 5A:
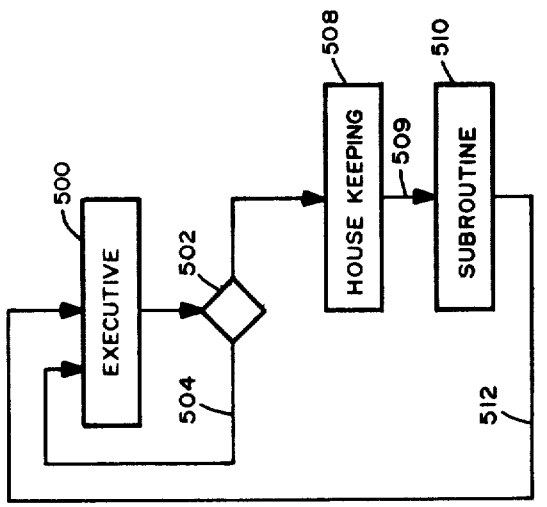

The computer will continue to iterate through the subroutine shown in FIG. 5C until the N parameter is decremented to zero, where the test in operation 555 will then cause the computer to exit the subroutine along path 512.

Figure 5D:
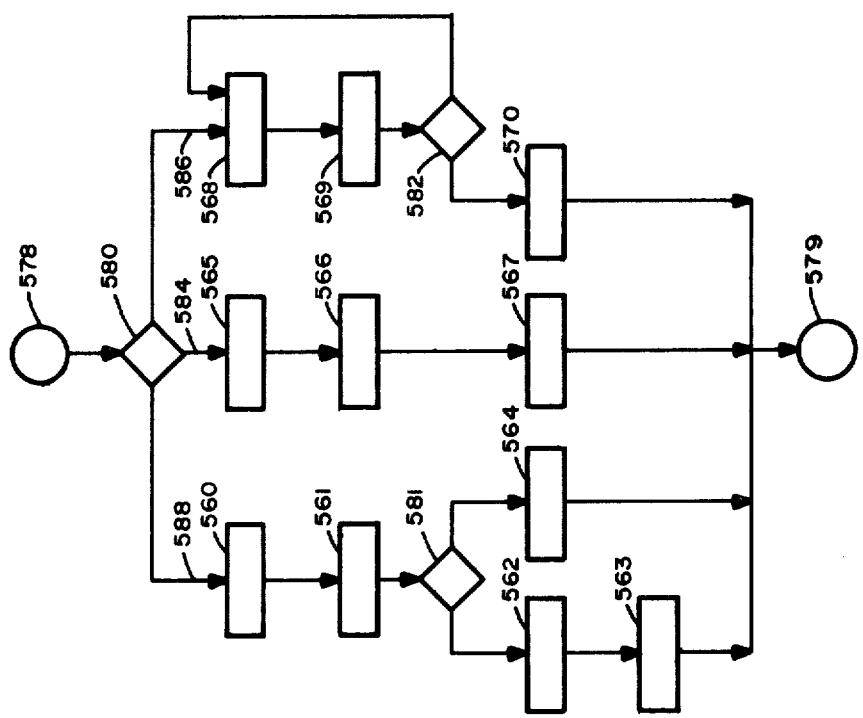

A more detailed description of the executive program will now be discussed to better illustrate the operation of this invention. FIG. 5D shows an example of how the executive program selects the appropriate subroutines, shown as rectangular blocks 560–570, in sequence or based upon decision elements, shown as diamond blocks 580–582. The computer 112 executes the executive program and associated program routines to build-up the audionic message. Although only a few subroutines are illustrated, it will become obvious to those skilled in the art that the sub-message sounds can be built-up virtually without limit to provide almost any type of audionic message.

For the example shown in FIG. 5D, the computer will enter this routine through operation 578 and exit through operation 579 to perform the illustrated operations. The decision operation 580 will cause the computer to follow paths 584, 586, or 588; dependent upon the message selected. Path 584 will cause the execution of subroutines 565–567 to provide a fixed sequence of sounds to be built up. Path 586 will cause the execution of subroutines 568–570, where subroutines 568 and 569 may be executed for a plurality of times to build up a repetitive pattern of sub-sound elements as defined by execution of decision element 582. Path 588 will cause the execution of subroutines 560–564, where either subroutines 562 and 563 or subroutine 564 may be executed as controlled with decision operation 581.

Subroutines may be re-entrant, where the return address is preserved upon entry for return to the executive routine. Multi-level subroutines may be programmed, where subroutine 566 may transfer to the subroutine group 568–570 with a re-entrant transfer to subroutine 568 and a return from subroutine 570. The subroutine group entered in operation 578 and exited in operation 579 may be a re-entrant subroutine group with a transfer to operation 578 and a return from operation 579.

Subroutines 560–570 may each provide a relatively simple sub-sound element, but when executed in conjunction with a plurality of other subroutines, may build-up a complex sound message.

Various sub-sounds may be generated with subroutines and then combined such as with superposition or other techniques to build up more complex sounds. For example, subroutines 565 and 566 may each generate sub-sounds of different frequencies, shapes, and amplitudes and subroutine 567 may combine these sub-sounds to provide a more complex sound pattern.

The packing and unpacking program operations will now be discussed.

A packed discrete word may be considered to be a word with a plurality of condition bits representing command conditons or status conditions. For example, the data processor can output a discrete packed word with command conditions to an interface register to command various discrete machine functions and the computer can input discrete word with status conditions from an interface register to define various discrete machine status conditions. The packing and unpacking of condition bits is performed under program control and provides interface hardware efficiency. It should be noted that a discrete condition may be a single binary bit either in the one or zero state located in a particular bit position of a digital word or may be a plurality of bits set in an array of one or zero states to define a more complex condition. As an example, a single bit may be sufficient to control the spindle on or off condition but a plurality of spindle speed bits may be required to define the various spindle speeds that can be commanded.

Status bits can be unpacked from an input word by logical ANDing or masking the input word with a control word, where the control word contains zeros in all of the non-related bit positions and ones in the related bit positions. The resultant masked word contains only the related conditions. Next, various program shifting operations are used to arrange the bit positions in the word, then various testing and processing operations detect the states of these condition bits for further processing.

Command bits can be packed into an output word by logical ANDing that word with a first control word; containing zeros in the bit positions to be modified to zero set the related bits in the command word, then logically ORing that command word with a second control word to pack command bits into the appropriate positions of the command word. The new command word is output to the interface register to generate machine commands and also stored in the computer as a record of the current machine command conditions.

In this manner, condition bits can be packed into or unpacked from digital words for the interface arrangement described herein. Other interface arrangements and programming methods will become obvious to those skilled in the art.

AUDIONIC PROGRAM GENERATION

A simple technique of recording the audionic samples will now be discussed with reference to FIG. 1. Speech signals 141 can be sensed with a microphone 140 and converted to digital signals 101 with an analog-to-digital (A/D) converter 164. A computer 112 controls the sampling of the A/D converter 164, monitors the samples 143, and stores the samples in memory 130. The stored samples constitute the audionic parameters to be used in the audionic system. These samples can be recorded with well known digital recording devices such as a tape punch 144 for later incorporation into an LSI-ROM audiionic memory with well known LSI-ROM techniques.

In order to minimize the requirement for audionic memory storage, several optimization techniques will now be discussed.

A first optimization technique uses an optimization program in a computer such as the sample computer 112. The computer 112 under program control samples the speech signals 141 and A/D converter 164 which may be at a rate greater than required for the audionic system. A preferred embodiment of an A/D converter 164 is discussed in detail hereafter. Other embodiments will become obvious to those skilled in the art. The computer 112 then analyzes the waveform with well known mathematical methods such as the Fourier method. Redundant and unncessary information is eliminated and the desired information is assembled into an audionic program. Optimization may include elimination of high frequency components, elimination of adjacent samples that have approximately the same amplitudes with a corresponding increase in the same period, and identification of similar waveform segments for subroutine generation.

It is important that the audionic messages have good esthetic qualities. Therefore, optimized audionic programs may be presented to an operator for approval. This may be accomplished by operating the audionic subsystem 100 with computer 112 and using D/A converter 302 and speaker 104 to convert from digital samples 101 to audionic messages 105 as discussed herein. The operator can command the computer 112 such as through control panel 114 to optimize the audionic program with different optimization techniques to obtain an acceptable audionic message with minimum audionic memory requirements. These optimization techniques include changing the frequency response, changing the sample phase or time relationships, changing various amplitude thresholds, and other such optimization techniques. Similarly, the audionic messages can be enhanced by varying the frequency relationships, amplitude relationships, and other speech characteristics.

A second optimization technique uses operator interaction such as with the computer 112. The speech waveform may be presented on a CRT display 158 and the operator may modify this waveform using a light pen 158 to communicate with the computer 112 with well known interactive CRT and computer arrangements. The operator may make a change in the waveform with the light pen 158, then listen to the audionic reply 105 through speaker 104 to determine the effect of the change. The change may be to eliminate a waveform component such as a peak, change an amplitude, change a waveform time or amplitude magnitude, match-up waveform portions by substituting one portion for another portion, and other such changes. If the change is not acceptable from the audionic reply, the operator can command the computer 112 such as with control panel 114 to restore it to a prior form.

A third optimization technique would be to record the speech waveforms on a strip chart recorder, manually edit the waveform, and manually program an optimized audionic reply program.

Audionic assembler and compiler programs may be used to provide audionic programs from input information such as waveform information. Waveform analysis such as for pattern recognition involves the sampling of the waveform with converter 164 and performing a computational analysis on the waveform information to define the characteristics and to diagnose the condition. For rapidly varying waveforms, the data processor 112 may not be able to process the information at a rapid enough rate to keep up with the desired sample rate. Otherwise stated, the sample rate requirements may exceed the computation rate capability. Therefore, an arrangement is presented that permits a low speed data processor to process high speed data samples.

The data processor 112 receives data samples from A/D converter 164 and stores these samples in memory 130. If the data processor 112 can not perform the processing of the samples in real time at the desired sample rate, the data processor will store the samples in real time and process the samples when time is available to perform the processing operations. The processing routines may be types of Fourier Analysis programs and pattern recognition programs.

As an example for an audionic system, the data processor 112 will accept voice samples 101 from A/D converter 164 and store these samples in memory 130. When processing time is avalable such as after the desired waveform has been adequately sampled, the data processor 112 will access the samples stored in memory 130 and perform the desired processing to optimize the audionic samples, diagnose the sound conditions, and other such functions.

The off-line waveform processing by the data processor 112 has a general applicability such as for diagnosing automotive waveforms as with ignition signals, diagnosing biological systems waveforms such as with an electrocardiogram, and other such applications.

The audionic memory capacity requirements are a function of the mix of characters and the quantity of characters. Different tasks may require different character arrangements such as with the alarm clock message system. An audionic assembler is provided that operates under program control in a computer such as the computer at the remote computer center 160 to accept a set of audionic messages such as through control panel 114 or tape reader 116 and assemble an audionic program for storage in audionic memory 130. This audionic program may be sub-character subroutines or other programs that can be used to generate the required audionic messages. The assembled program can then be output such as with tape punch 144 for use with an audionic system. The assembled audionic program and the particular messages can be loaded into an audionic memory 130 such as with tape reader 116 for use with an audionic system 110.

ELEMENTAL CONVERTER

The factored computer system of the parent applications is further exemplified with an elemental converter subsystem illustrated in FIG. 3. This elemental converter provides for conversion of both, analog inputs and analog outputs under computer program control. Computer 112 generates a composite output word to register 324 which may be the $C_I$-Register described in the parent application, Data Processing System. The composite word includes the digital information $C_I15Q$ through $C_I10Q$ 310 that is converted to an analog signal 306, output select address 330, and input select address 332. Output word -7 (OW-7) provides a gated clock to load the A-Register contents in the computer 112 into the $C_I$-Register 324 as a serial digital signal $A_oQ$. Serial feedback to the computer 112 may be provided as signal 300.

When operating in a D/A converter mode, computer 112 selects an output channel 331 with addresses 30 to connect the analog signal 319 to be applied to output lines 331, which may include well known line drivers and sample-and-hold networks for analog signal processing and storage. One output channel is shown as an audionic channel to amplifier 320 to excite speaker 104 with signal 103 to generate audionic signal 105. Output select logic 328 is composed of well known address decode logic and analog switches to conduct analog signal 319 to the selected output line 331. Such address decode logic and analog switches are well known in the art such as manufactured by Electronic Engineering Company of Santa Ana, Calif. as the EECO 762 Multi-Channel ADC and the EECO 765 Analog Multiplexer; Nortronics Corporation of Hawthorne, Calif. as the NADDAC-100 Solid State Converter; Hybrid Systems Corporation of Burlington, Mass. as the Model MUX201 Multiplexer; and Burr-Brown of Tucson, Ariz. as the Model MPM-8S Analog Multiplexer.

When operating in an A/D converter mode, computer 112 selects an input channel 333 with addresses 332 and disables output channels 331 with addresses 330, preventing extraneous outputs and connecting the selected analog input 333 to comparator 334 on signal line 336, which is compared to synthesized analog signal 319 to generate a digital compare signal 338 as a discrete input signal (DI-8) to computer 112.

The A/D converter 164 of this invention may be described as an elemental extremity, wherein the elemental converter 164 does not provide for the usual interface operations such as timing, sequencing, and controlling; which are performed by the data processor 112 in response to the stored program contained in the main memory 130. This converter 164 is processor dependent and requires data processor coaction for operation. The mutual interdependence of the data processor 112 and the elemental converter 64 further exemplifies the teachings of the factored computer system invention and may be contrasted to the off-line, stand-alone peripheral operation of prior art systems.

The data processor 112 provides processing and signal translating capability, yielding versatility and low cost. The converter 164 is a processor dependent extremity that is elemental in form and communicates with the data processor 112 in signal formats intrinsic to the converter 164. Operative dispersion is used to fulfill system requirements including signal translation and communication functions; where the data processor 112 processes the data in a time format intrinsic to the elemental converter 164.

The elemental converter 164 may be a part of a factored computer system 110, wherein some prime functions have been factored and separated from the converter 164. The factored prime functions of the converter 164 may be redundant, where these prime functions can be performed by the data processor 112. The data processor 112 is considered to be in a non-redundant, irreducible form. Factored prime functions of the converter 164 that are redundant in conventional arrangements are eliminated in the elemental converter 164 and performed with the data processor 112, thereby reducing the hardware associated with this converter and providing a minimal structured or elemental converter. The factored prime functions such as logic and sequencing are merged into the data processor 112 which performs these prime functions in response to the stored program under program control. The operation of this data processor 112 is therefore dispersed throughout the system such as for the performance of subtasks associated with elemental extremities, where the converter 164 is dependent on this operational dispersion of the data processor 112 in the performance of the operations. The system 110 may also be considered an integrated computer system, wherein the factored prime functions that are merged into the data processor causes an overlapping of converter subsystem functions as if the data process and converter subsystems were integrated together. For example, the sequencing and control operations are associated with the converter 164 but are performed by the data processor 112. Converter operations have been assumed by or integrated into the data processor 112, where these converter subtasks are performed by the data processor 112 with the resultant elimination of converter logic and interface circuitry.

The elemental converter 164 has a passive nature, where converter operation is dependent on data processor coaction to actively provide converter functions. This passivity results from the factoring and reduction of redundant prime functions.

The data processor 112 is physically distributed throughout the system, wherein portions of the data processor input-output section may be physically part of the elemental converter extremity. The internal processor signals such as micro-operation signals may be provided to the elemental extremity such as for the transfer of data between the data processor and converter subsystems.

The data processor 112 communicates with the elemental converter 164 in a signal form intrinsic to the elemental converter 164 and acceptable to the data processor 112. These intrinsic signal forms are translated from the data processor format into the converter intrinsic format under program control, then communicated to the elemental converter 164 in a format that is required by the elemental converter 164. One example of these formats is the elemental converter signals which are in a special preprocessed signal format with special sequencing relations intrinsic to the elemental converter. The data processor 112 performs the processing required to derive these signal forms intrinsic to the elemental converter subsystem 164.

The general purpose nature of the data processor 112 is thus extended to the elemental converter extremity.

A change can often be made in the operation of the elemental converter with merely a change in the stored program by the data processor, eliminating the requirement for a major redesign in the converter subsystem.

A processor dependent A/D converter increases the capability of a converter subsystem and reduces the amount of electronics required. As shown in FIG. 3, a stored program data processor 112 communicates with an elemental A/D converter 164 with serial whole word data $A_oQ$ 342 transferred from the data processor A-Register, with a gated clock OW-7 340 to clock the data into the converter register 324, and with a discrete input (DI-8) 338 for the data processor 112 to sample the converter output signal. Although most stored program data processors may be used, in a preferred embodiment the data processor 112 and signals 300, 338, 340, 342, and the $C_I$-Register 324 correspond to the system described in the referenced application Ser. No. 101,881.

A five bit analog-to-digital converter is discussed herein, although it will be obvious to those skilled in the art that other resolution converters can be implemented with this invention.

The data processor 112 under program control loads a digital approximation of the analog parameter into the register 324. The digital signals 310 are used as the input to a D/A converter 302 to generate the analog output signal 306 proportional to the digital parameter contained in register 324. Such D/A converters are well known to those skilled in the art and consist of analog switches 314 controlled with the digital signals 310 to selectively sum signals provided from a weighted resistor tree 316. This weighted summation provides an analog approximation signal 319, to be compared withe the analog input signal 336 with a well known electronic comparator 334 such as a Fairchild model 710 circuit. The comparison signal 338 is sampled by the data processor 112 to determine if the approximation analog signal 319 is greater than or less than the input analog signal 336 for use with a successive approximation computer alogorithm described hereafter or other data processor algorithm.

The analog input signal 336 can be a multiplexed signal from a plurality of analog input signals 333. Multiplexing is performed with analog multiplexor 329 and selection register 324 with digital selection signals 332. Selection register 324 is loaded with the input channel address from data processor 112 with data input signal $A_oQ$ 342 and gated clock signal OW-7 340.

Figure 6:
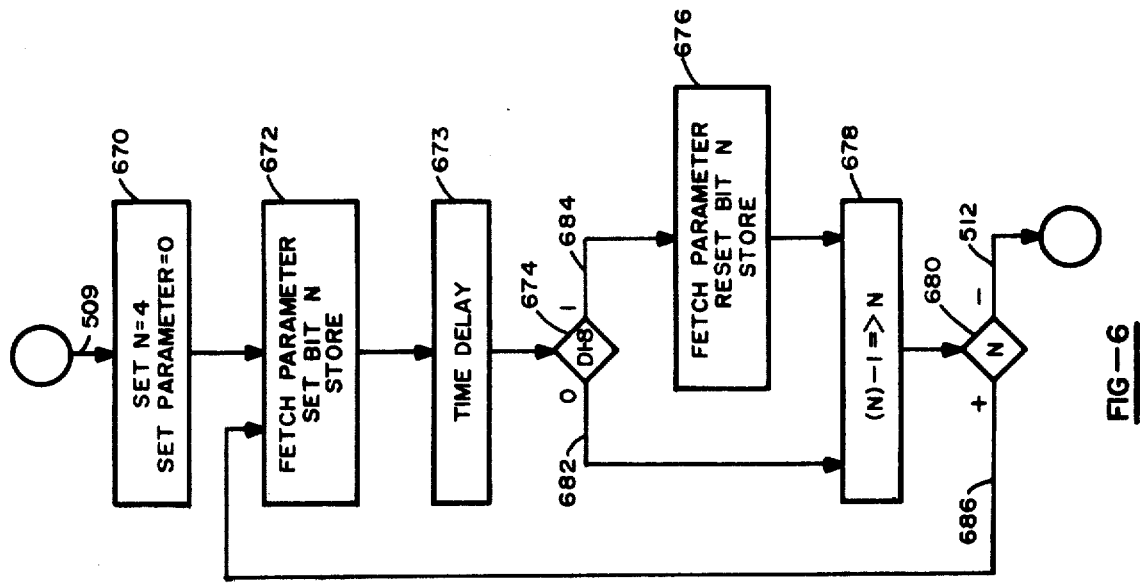
FIG. 6 shows a program flow diagram of converter operations.

A successive approximation data processor algorithm will now be discussed using the subroutine flow diagram shown in FIG. 6. Other algorithms will become obvious to those skilled in the art for the successive approximation method and for other methods.

The data processor 112 will enter the conversion subroutine along path 509 to operation 670, which initializes the algorithm parameters, sets the N word to four for five iterations, and zero sets the approximation parameter. The next operations 672, 673, 674, 676, 678 and 680 are within the iterative loop of the successive approximation algorithm. The computer will fetch the last approximation parameter in operation 672 which is initially set to zero, then one set the Nth bit, initially the fifth bit for N=4. This parameter is then stored for later use and is also output to the converter register 324 in operation 672. A time delay may next be provided in operation 673 to allow for settling of the analog approximation signal 319. The comparison signal 338 is next sampled by the data processor 112 such as with a skip-on-discrete instruction in operation 674. If the comparison signal 338 is a logical zero, the successive approximation parameter is still too small and the subroutine branches along path 682. If the comparison signal 338 is a logical one, the successive approximation parameter is too large, indicating that the parameter has "overshot" the number that is being approximated. Therefore, the subroutine branches along path 684 to operation 676 which fetches the parameter; resets bit N, the last bit set that cuased the "overshoot" condition; then stores the parameter for later use. The computer then executes operation 678 which decrements the N word for the next iteration to determine the condition of the next bit, which is the decremented Nth bit. A check is made in operation 680 to insure that the N word is non-negative, where a negative N word defines that the fifth and last bit has been processed and the conversion is complete. For this condition, the computation will follow path 512 to exit from the conversion subroutine. If the N word is non-negative, the computer branches along path 686 to execute operations 672, 673, 674, 676, 678, and 680 for the next successive iteration.

The flexibility of the data processor 112 permits the converter to operate in a modal fashion, with different conversion modes used for different conditions.

During system operation, the data processor 112 is often able to predict the value of the input analog parameter from prior samples recently performed, various system conditions, or other methods. Therefore, a prediction approximation parameter would be output to register 324. In one embodiment, the most significant portion of this predicted parameter would be used for the first approximation parameter, with the least significant bits determined with the successive approximation algorithm.

The processor dependent converter can also be used to perform the functions of a programmable comparator. In one embodiment, a programmable threshold digital parameter is loaded into register 324 to be compared to the analog input signal 336 to define if that signal is within that threshold. In another embodiment, a selected analog signal 336 is converted to the equivalent digital parameter, which is loaded into register 324 for comparison with a second multiplexed analog signal to determine which is larger.

The resolution of the processor dependent converter can be set by the data processor under program control to insure that only the required resolution is provided, thereby reducing processing time for the conversion.

In a preferred embodiment of the elemental converter, address information and data information are both "packed" together in the computer A-Register and output to the $C_f$-Register 324. For simplicity, the operations are not discussed in conjunction with the description of converter operation, but are described separately in the section entitled AUDIONIC PROGRAM OPERATIONS herein. Other packing and assembly operations to build-up digital words will become obvious to those skilled in the art.

OPERATION

An audionic system can be operated in response to external stimuli or in response to internal conditions. External stimuli can be provided with a keyboard such as keyboard 244 of control panel 114 for applications such as with a calculator. Internal conditions can be provided such as from internal timing operations under program control for applications such as with an audionic clock system. The appropriate audionic message can be provided under program control in response to the stimuli or condition.

Many of the types of operations described herein may use selected reply conditions or may use combinations of reply conditions, where the discussion of operation or mechanization with a single reply condition is presented for simplicity and does not preclude the alternate reply conditions.

An audionic system can be initialized to provide the desired operation selected from a plurality of different types of operation. Flexibility of the computer arrangement of this invention permits the system to be initialized with various operational parameters and conditions to customize the audionic system to the particular operator's requirements.

In one embodiment, a control panel 114 may be used with selector switches 240, 241, and 242 and with momentary switches as discussed for the operator panel in the referenced application Ser. No. 101,881. Other control arrangements will become obvious to those skilled in the art.

The calculator can be initialized by placing the Mode selector switch 240 to the Index position, placing the Parameter selector switch 242 to a position to select a parameter, then entering the desired command with the keyboard 244. The initialize parameters may define the reply rate, pitch, tone and other such control functions. Initialize commands can also define modes of operation and other discrete functions such as defined with M and G codes as discussed in the referenced application Ser. No. 101,881 and in the referenced application Ser. No. 230,872.

The audionic system can then be placed in the operate mode by placing the Mode selector switch 240 in the Keyboard position, then entering parameters with the keyboard 244, and then depressing the discrete command switches such as the Add 283, Subtract 285, Multiply 287, and Divide 289 switches to command the associated operations.

Input of operator commands is an important requirement for many applications of the audionic system 110. Human factors considerations require input devices such as switch input devices to have physical dimensions dictated by ease of operator useage. Reduction of the quantity and complexity of input devices can reduce the physical size considerations and simplify operation.

A description of a simplified switch input arrangement will now be presented for an automotive audionic system to exemplify a generalized switch input arrangement for a broad range of applications.

An automobile driver may control audionic responses with switches mounted in a convenient location such as on the periphery of a steering wheel. Depression of a select switch will cause a parameter to be audionically identified based upon the number of switch depressions. For example, the driver may depress the select switch once for a speed parameter, twice for a time parameter, thrice for an oil pressure parameter and so forth. The audionic system 110 will respond with the selection and a parameter such as:

"TIME-FIVE-FORTY-ONE-" or

"SPEED-FIFTY-SEVEN-" or other such parameter.

If the driver depresses the switch again during the message, the audionic system will cease the message and start a new message associated with the next sequential selection. As another example, the driver will depress the select switch for a period of time, where the period of time is related to the parameter. For example, each second of the period may relate to the next selection in sequence. After the parameter has been selected by the driver releasing the switch, the selected parameter will be presented audionically. To assist the driver, the periods may be counted off in audionic fashion as follows:

"-ONE-TWO-THREE-TIME-FOUR-THIRTY-TWO-"

or the selections may be counted off as follows:
"-SPEED-PRESSURE-TIME-FOUR-THIRTY-TWO"

where the solid underline is indicative of the required period of switch depression to select the time parameter and the dashed underline is indicative of the optional period of switch depression to select the time parameter.

The parameter sequence may be arranged to provide the most important parameter first for rapid access, with subsequent parameters provided in order of importance.

A Mode selector switch 240 may be used to select a mode such as a repeat mode to repeat the selected parameter at periodic intervals. As still another example, the computer 112 can provide an automatic scan of a selected set of parameters for operator cognizance. This scan will present a plurality of parameters in sequence either upon operator interrogation or automatically such as at periodic intervals.

As an audionic announciator, if a parameter passes a prescribed tolerance such as a preset speed limit, a minimum oil pressure, or a maximum temperature; then the parameter would be presented in audionic message form to alert the operator to the condition.

Inputs for an audionic system can be provided with switches, which will now be described for an audionic clock application using the control panel of FIG. 2 to exemplify input operations. The operator will position the Mode selector switch 240 to the Jog position, the Jog selector switch 241 to the Continuous or step position, and the Parameter selector switch 242 to the selected parameter position. The operator will next depress the appropriate slew switch 252 to slew the time parameter in the desired direction. As the time parameter is updated by the computer 112, audionic messages are presented to alert the operator to the updated time parameter. The operator can also verify the latest time parameter by depressing the repeat switch 282. In an alternate arrangement, the operator would position the Mode selector switch 240 to the Keyboard position 284, position the Parameter selector switch 242 to the appropriate parameter position such as Time 243, and enter the time parameter with the Keyboard 244. The audionic clock system would repeat the time and start the clock timing operations when the Cycle Start switch 246 is depressed. Although the control panel 114 is arranged for general purpose applications, a control panel arrangement optimized for a particular application will now become obvious to those skilled in the art.

Various audio controls may be provided to permit the operator to control characteristics of the audio reply with programmable parameters. These characteristics include reply rate, audio pitch, audio tone, volume, quality, frequency, fidelity, and other such characteristics. The selected control parameter may be entered by selection of the parameter address with the Parameter selector switch 242 and entry of the parameter value with the keyboard switches 244 as described in the parent application, Data Processing System. Other parameter entry arrangements will become obvious to those skilled in the art.

A rate control permits an operator to select a reply rate desired for a mode of operation or other considerations. For example, a high speed calculator keyborad entry mode of operation would require rapid response to provide a full echo response for a key depression before the next key is depressed. A slower reply rate is applicable to an operator with a slower data entry rate. The computer 112 is responsive to a rate control parameter and processes an audio program routine to provide the commanded reply rate. It may not be practical to merely speed up the sample rate because of the associated increase in frequency of the audio reply. One practical arrangement for increasing the rate is for the routine to selectively remove redundant information such as by deleting every fifth sample for an increase in rate by approximately 20% and by deleting every other sample for an increase in rate by approximately a factor of two. Other techniques for rate control will become obvious to those skilled in the art.

An audio pitch control permits an operator to select a desired frequency such as for personal preference, esthetics, and clarity. The computer 112 is responsive to a pitch control parameter and processes an audio routine to provide a commanded pitch. This may be accomplished by adjusting the time between samples to provide a commanded pitch or by other techniques that will become obvious to those skilled in the art.

Other audio controls may be used to permit an operator to define characteristics of an audio reply such as applying an exponential multiplier or a constant multiplier or both of these values, which may be operator programmable, to the output sample such as for a tone control or a volume control. Other programmable parameters will become obvious to those skilled in the art.

A Sub-Mode selector switch 241 will permit an operator to select various sub-modes of operation such as single reply, continuous reply, or scan reply. Single reply will cause a single audio reply for each switch actuated. Continuous reply will cause a selected parameter to be continuously repeated. Scan reply will cause a group of parameters to be scanned with an audio reply for each parameter presented in sequence.

APPLICATIONS

The audionic system described herein can be used in a wide range of applications, where an audionic calculator and an audionic clock are typical of these applications. Other applications include a typewriter, medical testor, data concentrator, musical instruments, monitor, vehicular announciator, cash register, appliance, and other described herein. The broad scope of this audionic invention permits it to be used in virtually every system involved in communicating with an operator or where operator feedback would enhance utilization. Therefore, the applications described herein are in no way intended to place a limitation on the broad applicability of this invention.

The audionic system provides greater economy when two or more functions are performed by the same system. As an example, an audionic clock can be provided with an audionic calculator for only a small additional cost for the clock functions. As another example, an audionic system for an automobile may include an audionic calculator and an audionic clock with only a small additional cost. Therefore, audionic devices may be compatible and it is intended that the audionic devices may be combined to provide multi-function capability to achieve greater capability without significantly increasing costs.

Audionic messages can be presented by the build-up of sub-character sounds to provide characters, then the statement of characters to provide a complete message. In order to disclose audio messages in text form herein, an audio notation is provided. The audio message is shown in quotations and dashes ("- -") and the characters are separated by dashes (-). Several examples are presented below:

"-two-"
"-five-fifty-three-point-five-"
"-six-thirty-five-and-three-seconds-"

Further examples are disclosed hereafter to exemplify the operation of the system. Audio tones will be designated with the terms "-beep A-beep B-". A pause or time delay will be designated with the term "-...-" as with "-five-...-beep-".

The audionic stimulus to initiate an audionic message may include switch actuation or automatic stimuli such as internal system timing as discussed herein. In order to disclose system operation, with examples, a stimulus notation is provided and may be used in conjunction with the previously discussed audio notation. The stimulus notation is shown with the stimulus designation between astericks (* *). A list of stimulii are shown below:

| | |
|---|---|
| *1* | Keyboard switch 1 |
| *5* | Keyboard switch 5 |
| *+* | Add switch |
| *=* | Equals switch |
| *TIME* | Time switch |
| *AUTO* | Automatic such as for timing with a system clock. |

Various audionic effects may be provided such as greater volume for important messages, wailing or other forms of modulation for special effects, modulated audionic signals at a carrier frequency for transmission of information over a telephone data link, and other such effects. These effects may be provided with superposition techniques or other techniques that are discussed herein. Still other effects may be provided with still other techniques that will become obvious to those skilled in the art.

An audionic system may be arranged to provide a plurality of tasks comprising at least one main task and at least one subtask. These tasks may be combinations of audionic tasks and non-audionic tasks. As an example, a main task may be the control of a vehicle and a subtask may be providing audio messages as described herein. As another example, a main task may be operating as an audionic calculator and a subtask may be operating as an audionic clock. As still another example, a plurality of main tasks may include control of cash register operations and performance of audionic calculator operations and a plurality of subtasks may include data logging, off-line data transmission, and performance of audionic clock operations. Incorporation of a stored program computer in an audionic system thereby provides flexibility and capability for performance of a plurality of tasks. Therefore, the audionic tasks described herein may be provided in combination with each other and with other tasks to further expand system capability.

AUDIONIC CALCULATOR

An audionic calculator will now be described for the audionic system of FIGS. 1A and 1B. The operator will depress momentary switches on the control panel 114 to provide input data and to command calculator operations. The computer 112 is responsive to switch input signals and provides an audionic reply for feedback to the operator for interactive operation, then the computer 112 processes the input switch condition as required.

The operator can command the calculator 110 to repeat an audio message for each depression of a Repeat switch 282. The reply may pertain to the last parameter entered by the operator through the keyboard 244 for parameter verification or may pertain to the solution of a calculation if the last switch actuated was a discrete command switch such as the Add switch 283.

A simple example of an arithmetic add operation will now be presented in switch and audio notation to exemplify audionic calculator operation.

| | |
|---|---|
| *CLEAR* | "-CLEAR-" |
| *1* | "-ONE-" |
| *5* | "-FIVE-" |
| *.* | "-POINT-" |
| *3* | "-THREE-" |
| *+* | "-PLUS-" |
| *5* | "-FIVE-" |
| *7* | "-SEVEN-" |
| *.* | "-POINT-" |
| *2* | "-TWO-" |
| *=* | "-SUM-SEVEN-TWO-POINT-FIVE-" |
| *REPEAT* | "-SUM-SEVEN-TWO-POINT-FIVE-" |

The Repeat command can also be implemented to cause the audionic calculator to repeat the complete problem (15.3+57.2=72.5).

It will be obvious to those skilled in the art that other operations can be commanded with the switches on control panel 114 such as with Add switch 283, Subtract switch 285, Multiply switch 287, Divide switch 289 and other such control switches.

AUDIONIC CLOCK

An audionic clock will now be described for the audionic system of FIGS. 1A and 1B. The computer 112 will continually accumulate time as a real time parameter and convert this parameter to the desired form for audionic messages upon the desired stimulus. The audionic clock provides multiple function capability. The functions include a basic clock, a periodic clock, an alarm clock, an itinerary reminder, and other capability that will now become obvious to those skilled in the art from the teachings of this invention.

The basic audionic clock mode will cause the computer 112 to update time such as with the real time clock operating under program control. The clock will generate an audionic reply upon interrogation to define the time. The time can include the hours, minutes, seconds, and, if desired, fractions of seconds and can present time based upon a twelve hour or twenty four hour schedule. The audio time message can pertain to the time at which the clock was interrogated, or, with a look ahead feature, the time at which the audio reply is completed, or the time defined by an audio tone shortly after the audio reply. Several examples will now be presented to exemplify this operation. A twelve hour clock operating mode may reply with:

| *TIME* | "-EIGHT-FIFTY-FIVE-AND-SEVENTEEN-SECONDS-" |
|---|---|

A twenty-four hour clock operating mode may reply with:

| *TIME* | "-EIGHT-FIFTY-FIVE-PM-AND-SEVENTEEN-SECONDS-" |
|---|---| or with:

| *TIME* | "-TWENTY-FIFTY-FIVE-AND-SEVENTEEN-SECONDS-" |
|---|---|

A time tone operating mode may reply with:

| *TIME* | "-EIGHT-FIFTY-FIVE-AND-SEVENTEEN-SECONDS-....-BEEP A-" |
|---|---|

In a continuous mode of operation, the audionic clock would, upon interrogation, initially define the complete time, then repeat only the changed parameters as time increases and discontinue the count upon switch actuation. Several examples will now be presented to exemplify various forms of this continuous operation. In one example, continuous time will be presented with a one second resolution.

| *TIME* | "-EIGHT-FIFTY-NINE-AND-FORTY-EIGHT-SECONDS-....-BEED-NINE-....-BEEP-FIFTY-SECONDS-....-BEEP-ONE-....-BEEP-TWO-....-BEEP-THREE-...BEEP-FOUR-....-BEEP-FIVE-....-BEEP-SIX-....-BEEP-SEVEN-....-BEEP-EIGHT-....-BEEP-NINE-....-BEEP-NINE-O'CLOCK-SHARP-....-BEEP-ONE-....- |
|---|---|
| *TIME* | BEEP-TWO-....-" |

In another example, the time may be presented in speech form at periodic intervals such as at every quarter minute on the quarter minute. Tones can be used to provide rapid resolution intervals such as at every second or at every half second interval. Different tones can be used for larger intervals such as at every five second interval. Further, tones can be superimposed on speech to resolve time intervals during speech periods. One form of this continuous operation is described in the following example.

| *TIME* | "-EIGHT-FIFTY-NINE-AND-FORTY-EIGHT-SECONDS-....-BEEP A-....-BEEP B-....-BEEP A-....-BEEP A-....-BEEP A-....-BEEP A-....-BEEP C-....-BEEP A-....-BEEP A-....-BEEP A-....-BEEP A-....-NINE-O'CLOCK-SHARP-....- |
|---|---|

| *TIME* | BEEP A-....-BEEP A-...." |
|---|---|

In a Greenwich Mean Time (GMT) mode of operation, the computer will accept time zone information from the control panel and provide audionic messages for the selected time zone.

In a stop watch mode of operation, the audionic clock would, upon interrogation, start counting from zero continuously as described for the continuous mode of operation. Upon a stop signal, the clock would start repeating the accumulated time to that stop signal. The accumulating time could be presented as discussed for the continuous mode, rounding off the time to the second or other convenient resolution. The final time could be presented with a high resolution such as one hundredths of a second. An alternate stop watch mode of operation would provide rapid audio tone replies for each resolution increment of time. One mode of operation is exemplified with the following example:

| *STOP* | "-ONE-....-TWO-....-THREE-....-FOUR-....-FIVE-...- |
|---|---|
| *STOP* | FIVE-POINT-SEVEN-FOUR-SECONDS-FIVE-POINT-SEVEN- |
| *TIME* | FOUR-SECONDS-" |

The stop watch Stop switch 262 causes the computer 112 to exit the normal mode of operation and to enter the stop watch mode of operation, but the computer 112 will continue to keep track of real time independent of the mode of operation. The Time switch 263 returns the clock to the normal mode of operation.

In a periodic clock mode of operation, the audionic clock would present an audio reply for each periodic occurance. These periodic occurances could be each fifteen minutes on the quarter hour or other desired occurance. This form of operation is illustrated in the following example:

| *AUTO* | -....-EIGHT-FIFTEEN-....-BEEP- |
|---|---|
| *AUTO* | -....-EIGHT-THIRTY-....-BEEP- |
| *AUTO* | -....-EIGHT-FORTY-FIVE-....-BEEP- |
| *AUTO* | -....-NINE-O'CLOCK-....-BEEP- |

As another periodic mode of operation, the audionic clock can provide chimes or beeps as with the well known chiming clocks.

In an alarm clock mode of operation, the audionic clock would accept a preload time parameter such as through the control panel 114 which would be stored and periodically compared with the actual time. When the actual time and the preload time compare, an audio reply would be generated. This audio reply could be a preloaded time, the actual time as continuously updated, a tone, or other selected audio reply. Further, this reply could be a single audio reply or a continuously presented reply. A plurality of preload time parameters could be entered for a plurality of alarm conditions. With a calendar feature described hereafter, the preload parameters could be entered with the data parameter to provide an alarm schedule for a long period of time such as for a week. The audio reply alarm could be louder than the audio reply for other modes of operation to insure that the operator's attention is attracted. As an alternate, the audio reply could start quietly in a continuous mode of operation and continue to increase in volume until turned-off with the selected stimulus.

In an itinerary mode of operation, the alarm clock mode would be expanded to present a message with each audio reply alarm. The messages could provide a calendar of appointments for an executive, a set of traveling instructions for a traveler, or a general reminder schedule. The messages can be loaded manually with the control panel 114, automatically with the tape reader 116, or with other input devices.

Other modes of operation will become obvious to those skilled in the art.

AUDIONIC TYPEWRITER

A typewriter 156 is an example of a system requiring operator interaction for performing a task, wherein the task may be providing a hard copy document such as a letter or may be the conversion of information to digital electrical form such as with a Teletype Corporation model ASR-33 TELETYPEWRITER. The use of an audionic typewriter 156 enhances operator interaction by providing audionic message feedback to the operator. The audionic subsystem 100 could be provided as an integral part of the typewriter, as an attachment for the typewriter, or as an independent subsystem operating in response to typewriter signals.

A typewriter 156 is typically used by an operator with visual attention fixed on the material being typed using conditioned typing reflexes to select typewriter keys without visually verifying that the proper key has been depressed and the proper print element has been actuated. An audionic typewriter 156 is responsive to operator actions and provides an audionic messsage defining the condition that is input to the typewriter. This audionic message provides feedback to the operator to verify proper operation and to detect errors.

An example of audionic typewriter operation will now be presented for typing a letter using the audionic and switch notation previously defined.

|  | EXAMPLE I | EXAMPLE II |
|---|---|---|
| *D* | "-CAP DEE-" |  |
| *e* | *-EE-" |  |
| *a* | "-AH-" |  |
| *r* | "-AR-" | "-DEAR-" |
| *SPACE* | "-SPACE-" | "-SPACE-" |
| *M* | "-CAP EM-" |  |
| *r* | "-AR-" |  |
| *.* | "-PERIOD-" | "-ABB. MISTER-38 |
| *SPACE* | "-SPACE-" | "-SPACE-" |
| *J* | "-CAP JAY-" |  |
| *o* | "-OH-" |  |
| *n* | "-EN-" |  |
| *e* | "-EE-" |  |
| *s* | "-ES-" | "-JONES-" |
| *:* | "-COLON-" | "-COLON-" |

Example I defines a simple character feedback arrangement. A more sophisticated system with a large stored vocabulary could respond with complete audionic word messages as illustrated in Example II above. This would be accomplished by accumulating the characters for a word, then using a table lookup or other arrangement for selecting the appropriate word from an audionic vocabulary memory for message feedback.

For a communication typewriter such as the TELETYPEWRITER, information can be transmitted to a remote location over a data link such as a telephone line, then reconstructed into audionic messages either for the characters as described in Example I above or into complete words as described in Example II above and as described in more detail hereafter under the subtitle Audionic Data Concentrator.

The controls previously discussed such as repeat, volume, pitch and others are equally applicable to the audionic typewriter.

In the prior art, it is often necessary to "proof" typing by comparing the original copy with the final typed copy. This comparison is tedious and often requires two secretaries, one secretary to read the original copy and a second secretary to compare it with the typed copy. In one embodiment of this invention, the typed audionic information may be recorded, then played back for this "proof reading." The typing may be recorded in main memory 130, auxiliary memory 152, tape punch 144, or other well known digital storage arrangement.

AUDIONIC CASH REGISTER

An audionic cash register application will now be described for the audionic system of FIGS. 1A and 1B. As described for the audionic calculator and typewriter, the audionic cash register can echo back audionic messages in response to the keys depressed. Although the control panel 114 is not optimized for a cash register application, it is exemplary of the cash register control functions. The operator will depress switches such as with keyboard switches 244 and receive audionic responses.

In a more sophisticated application, the computer 112 will receive inputs identifying the product such as with a coded input through the control panel 114, an input from a label reader or tape reader 116, or other inputs from input devices; then the computer will respond with a descriptive audionic message. As an example, a supermarket checkout register operator will read a number 5721 from a box of cereal and type:

| *5* | "-FIVE-" |
|---|---|
| *7* | "-SEVEN-" |
| *2* | "-TWO-" |
| *1* | "-ONE-" |
| *ENTER* | "-GROCERIES-CEREAL-FIFTY-SEVEN-CENTS-" |

This response alerts the customer as to the item and the charges which are related to the coded number. As another example, the operator will place a bag of oranges on a scale and enter the number 3495 stamped on the oranges. The computer 112 will monitor the input 333A from scale 360, convert the weight parameter, look up the cost of the item, and respond as follows:

| *3* | "-THREE-" |
|---|---|
| *4* | "-FOUR-" |
| *9* | "-NINE-" |
| *5* | "-FIVE-" |
| *ENTER* | "-PRODUCE-ORANGES-NINTEEN-CENTS-PER-POUND-SEVEN-POUNDS-EIGHT-OUNCES-ONE-DOLLAR-FORTY-THREE-CENTS-" |

The term cash register is used to exemplify a particular application and is intended to mean a generalized point-of-sale checkout, or other such tally type device. Other audionic register arrangements will now become obvious to those skilled in the art. Such a generalized point-of-sale system may be operated by a sales person in conjunction with a customer, as is common in the prior art cash register systems such as in a grocery store. Typically, the sales person will operate the system and the customer will monitor the audionic responses. This system may also provide a data logging and calculator capability and may provide a hard copy output such as with the prior art cash register "tapes". In a point-of-sale system, a sales person may be termed an operator and a customer may be termed a monitor for the transaction.

An audionic cash register or point-of-sale system is intended herein to include a system for performing customer transactions such as for the purchase of products by a customer.

MULTI-TERMINAL SYSTEM

A multi-terminal audionic system will now be discussed for the audionic system shown in FIGS. 1A and 1B. This multi-terminal system will be discussed for a point-of-sale system such as using a plurality of cash registers. A central computer system 110 with computer 112 and audionic memory, which may be the main memory 130 or the auxiliary memory 152, are interconnected to a plurality of terminals each having an audionic subsystem 100, including interface 102 and transducer 104. The audionic memory 130 or 152 stores audionic messages or submessages that are provided to each terminal as required.

The audionic memory may be shared between a plurality of terminals and may be time shared such as under program control of computer 112. Because audionic message sample rates are typically less than 10,000 samples per second and because a computer 112 may be able to generate samples at a 100,000 samples per second rate, therefore a computer 112 may be able to control a plurality of audionic subsystems in different terminals and with different messages which may be provided simultaneously. The terminals may be located in close proximity to the central unit or may be located remotely such as at various locations in a large store as with cash registers.

The audionic messages may be the same as discussed herein for the audionic register system or may be other message forms that will become obvious to those skilled in the art.

The multiple terminals may each be driven from an output channel 331 such as shown for output channel 331A; where a transducer and associated drive electronics, such as sample-and-hold amplifier 320, would be provided for each channel.

VEHICULAR ANNOUNCIATOR

A vehicular audionic system will now be discussed for the audionic system of FIGS. 1A and 1B for use in a vehicle such as an aircraft or an automobile. Important parameters such as speed may be sensed by the computer 112. A speed sensor interrogated through A/D converter 164 may provide required inputs for processing. The computer 112 can generate the desired audionic reply 105 for operator cognizance of conditions. Many parameters can be presented with an audionic message such as speed, fuel level, pressure, and other parameters which can be selected with a parameter switch 242 or with other arrangements as discussed herein. Other parameters can be presented when the value exceeds a predefined tolerance. Parameters can be presented in audionic message form when interrogated by an operator, periodically under timer control, or sequentially under scanner control or in various combinations of these presentations. Parameters can also be presented in audionic message form when certain conditions occur such as (1) presenting a parameter whenever the value changes by a predefined increment such as velocity for each five mile per hour change, time for each fifteen minute change, distance for each ten mile change, fuel for each gallon change or other such presentations, (2) presenting a parameter whenever an associated condition occurs such as velocity when the brake is applied, or velocity when the steering wheel is turned past the center position, or (3) other such presentations.

A vehicular system is herein intended to be generally interpreted in broad terms and to include vehicles for transportation and for generalized locomotion such as automobiles, aircraft, watercraft, locomotives, and other such vehicles.

AUDIONIC MEDICAL TESTOR

An audionic reply system may be used as a testor to calibrate a persons hearing such as in a medical application. The system would generate audio stimuli and would monitor the operator responses to these stimuli. The operator responses could be obtained automatically with biological sensors, manually such as with an operator switch control, or with other arrangements that will become obvious to those skilled in the art.

Present test systems are manual devices that generate frequency tones with oscillator circuits and volume potentiometers manually controlled by a test technician. These systems are limited in capability and provide only simple static tones. An arrangement is presented where dynamic tones can be provided such as continuously varying amplitude or frequency or both and to provide complex sounds to detect subtle hearing conditions.

As illustrated in FIG. 3, computer 112 is responsive to a test program such as from memory 130 or tape reader 116 for generating audio test signals with the audionic subsystem 100. The computer 112 is responsive to operator responses from operator input controls 114 and processes these responses to calibrate the operator's audio responsiveness. The computer can provide outputs 331B and 331C for X-Y recorder 362 to plot the frequency verses amplitude response of the operator. Other input arrangements will become obvious to those skilled in the art such as with other program sources, operator input devices, and output devices.

An adaptive control arrangement can be provided where the computer 112 generates a tone at low amplitude and gradually increases the tone until an operator response is received. The computer can periodically present signals at that tone bracketing the operator's threshold previously detected to be used as a precision calibration and as a double check on the test information.

Operator response data can be correlated with the particular operator's historical records to detect changes in audio response and can be correlated with the audio responses of other operators to provide statistical correlations. This correlation and record keeping can be performed with the computer 112 in the audionic system 110 or with a hierarchy arrangement such as with a remote large scale computer 160 receiving data over data link 150 or other arrangement for transferring digital data.

This arrangement is particularly suitable for a testing bureau such as in a clinic or office, where a patient would present himself for automatic testing. The test results would then be made available such as to a doctor for diagnosis of a medical condition. A franchise operation could be organized to provide this testing service in centrally located facilities.

Audionic outputs may be provided to each of a plurality of individual patients such as discussed for the Multi-Terminal System.

AUDIONIC DATA CONCENTRATOR

Voice communication contains many redundancies and is therefore inefficient. Redundancies may be greatly reduced with digital data communication. Unfortunately, an operator can't directly interpret digital data. Therefore, an audionic data concentrator arrangement will now be discussed to provide digital communication of audionic messages and the conversion from digital to audionic form with an audionic system 110.

Figure 7:
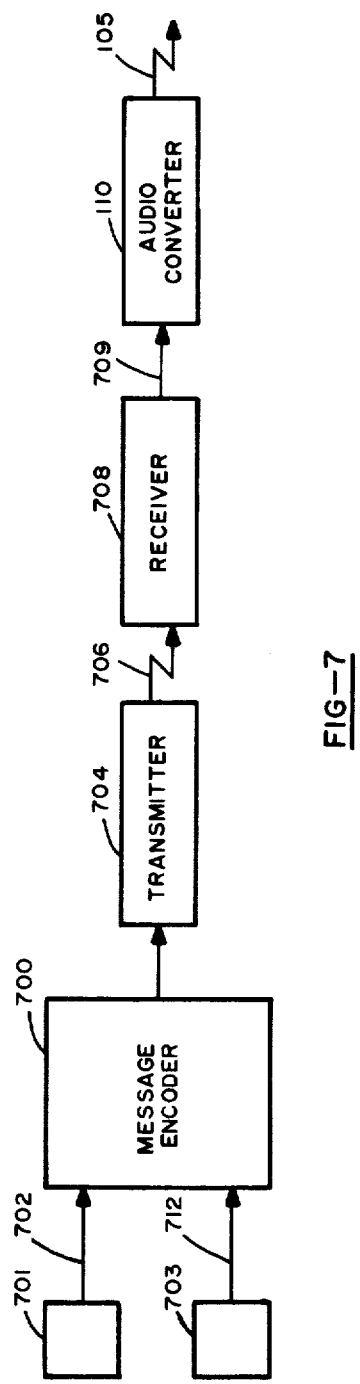
FIG. 7 is a block diagram of an audionic communication link.

An arrangement is illustrated in FIG. 7, where a message encoder 700 receives messages 702 from an input device 701 which are encoded into digital form and provided to transmitter 704 to transmit signal 706. Receiver 708 receives signal 706 and provides the received information to the audionic converter 110 to generate the audionic message 105.

The input device 701 may be a typewriter such as the well known TELETYPEWRITER or a type reader providing digital input information 702, where message encoder 700 processes this input information to generate digital messages that can be interpreted by audionic converter 110 to generate the audionic messages 105. An alternate arrangement uses an audio input device 703 such as a microphone 140 and an A/D converter 164 to provide digital speech samples 712 to encoder 700 which are converted to digital messages that can be interpreted by audionic converter 110 to generate the audionic messages 105.

Message encoder 700 may be a large scale computer 160 which is programmed to analyze the audio signal samples such as with well known pattern recognition programs for generation of the digital messages.

The transmitted digital data 706 can be a binary code that identifies a syllable, word, or other such character. When received, the digital data 709 is processed by the audionic converter 110 to generate audionic signals 105.

Efficiency of the audionic data concentrator will now be described by way of example. For a vocabulary of 1000 words, a ten bit binary code can be used to select one word from the vocabulary. Assuming for this example that an audio channel has a bandwidth of 10 KHz and an average audio word has a one second duration; then approximately five thousand bits of digital information can be transmitted over that channel per second, relating to 500 ten bit binary word codes transmitted per second. This provides a data concentration efficiency of 500 to 1, where 500 digital channels can now be transmitted on a single channel that could only accommodate a single speech channel.

Another advantage of the audionic data concentrator is the convenience of encoding the digital data for security or other such purposes and the ease of changing these codes. In one application, an audionic data concentrator could be provided for police car communication, where a limited vocabulary consisting of the numerals and a few control words could be provided. A vocabulary of only 32 words would permit five bit binary codes to be used and would greatly reduce the audionic memory requirements for the receiver in the vehicle.

AUDIONIC MUSICAL INSTRUMENTS

An audionic reply system may be used to provide musical responses such as for an electronic instrument. Although electronic organs are in wide use, these organs are implemented with special purpose frequency generators, filters, and other such equipment. The use of a stored program digital computer operating under program control with an audionic memory portion as disclosed herein is a unique, flexible arrangement not anticipated in the prior art. As an example, an electronic organ has special frequency generators for each frequency signal, where these signals are summed with filters to provide a composite musical signal. The audionic system of this invention uses a data processor to generate complex time and amplitude relationships in the digital domain under program control using programming techniques such as multi-level subroutines and computational techniques including addition and multiplication to provide composite signal samples in digital form, then converting to an analog signal with D/A converter 302.

A programmable musical instrument can be configured around the audionic system 110, where a program input device such as a tape reader 116 can cause the system to generate a musical reply as programmed. This programmed input can be in the form of digital codes representing a music sheet such as shown in Table II. A block of input commands would define the note duration, note selection, and other such definitions. Many notes could be combined in a block to define a complex musical arrangement such as to simulate an orchestra with many instruments.

TABLE II

| NOTE DURATION | |
|---|---|
| full | G01 |
| half | G02 |
| quarter | G03 |
| eighth | G04 |
| NOTE VALUE | |
| 1 | S00001 |
| 2 | S00010 |
| 3 | S00011 |
| 4 | S00100 |
| 5 | S00101 |
| . | . |
| . | . |
| n | S11111 |

AUDIONIC MONITOR

The audionic system can be implemented as a signal monitoring system, where an input A/D converter 164 monitors signals 333 and provides an audionic message 105 related to a particular signal 336.

Computer 112 monitors control panel 114 to sense operator selection of a signal such as with selector switch 242, then selects input signal 336 with address 332 to input selector 329 and converts the analog signal to a digital number with the A/D converter program routine discussed herein. The computer 112 then presents an audionic message 105 related to the selected signal. The selected signal can have selected characteristics such as an analog amplitude, a frequency, a phase a pulse width, or other well known signal characteristics to be monitored and presented in audionic form.

One embodiment of this signal monitoring capability could be in an operator panel which monitors system conditions for operator cognizance. Multiple meters and other such instruments may be replaced with an audionic system for monitoring signal characteristics and presenting the signal parameters to the operator in audionic form.

Another application would be a vehicle such as an automobile or an aircraft, where selection of a signal by the operator would cause the computer 112 to provide the parameter in audionic form. For example, parameters such as velocity, fuel level, oil pressure, temperature could be selected and presented in audionic form.

A scan mode can be provided where the computer 112 would sequentially select various signals and provide a sequence of audionic messages. One example for an automobile could be:
"-SPEED-THIRTY-FIVE
-FUEL-ONE-FIFTH
-OIL-PRESSURE-FIFTY-THREE
-TEMP-ONE-THIRTY-FIVE
-TIME-SEVEN-FORTY-THREE-"

An announciator mode can be provided, where the computer 112 would monitor a set of critical signals and provide an announcement if a signal exceeded a preset threshold such as excess velocity or temperature or insufficient fuel or oil pressure.

SCOPE AND DEFINITIONS

The invention disclosed herein is presented in a preferred embodiment of a digital audionic system to exemplify the inventive features, but the scope of this invention is much broader than illustrated with the preferred embodiment. This scope is intended to be broadly interpreted to cover the general fields of interaction between an operator and a machine or other device.

In order to describe the features of this invention, simplified block diagrams and schematic diagrams are used having symbolic representations. As an example, digital logic is shown using symbols associated with digital integrated circuits such as the Texas Instruments series 7400 integrated circuits. As another example, analog switches are shown symbolically in FIG. 3 which may be implemented with FET switches or other analog switches. The detailed circuit arrangements to implement the symbolic representations will become obvious to those skilled in the art.

Various publications may be used for providing background for this invention and for illustrating the prior art. The various subject areas and associated references for each subject area are listed below.
1. Pattern recognition is described in the book *Computer-Oriented Approaches to Pattern Recognition* by William S. Meisel for Academic Press (1972).
2. Integrated circuit technology is described in the book *Integrated Circuits* by Raymond M. Warner, Jr. and James N. Fordemwalt (Editors) for McGraw-Hill Book Company (1965).
3. Digital computer technology is described in the books
   a. *Digital Computer Design* by Edward L. Braun for Academic Press (1963) and
   b. *Digital Computer Design Fundamentals* by Yaohan Chu for McGraw Hill (1962).
4. Digital computer programming is described in the books
   a. Programming: *An Introduction to Computer Languages and Techniques* by Ward Douglas Maurer for Holden Day Inc. (1968)
   b. *Programming for Digital Computers* by Joachim Jeenel for McGraw Hill (1959), and
   c. *Elements of Computer Programming* by Swallow and Price for Holt, Rinehart, and Winston (1965).
   d. *Programming And Coding Digital Computers* by Philip M. Sherman for John Wiley & Sons Inc. (1963).
   e. *Digital Computer Programming* by Peter A. Start for MacMillian Co. (1967).
   f. IBM 360 *Programming And Computing* by Golden and Leichus and Prentis-Hall Inc. (1967).
   g. *Fundamentals of Flowcharting* by Thomas J. Schriber for John Wiley & Sons, Inc. (1969).
   h. *Designof Real-Time Computer Systems* by James Martin.
5. Audio technology is described in the books
   a. *Speech Analysis, Synthesis, and Perception* (Second Edition) by J. L. Flanagan for Springer-Verlag (1972); particularly in Chapter VI (P. 204–275) on Speech Synthesis and Chapter VIII (p. 321–405) on Systems for Analysis-Synthesis Telephony and
   b. Manual of Phonetics by Bertil Malmberg (Editor) for North-Holland Publishing Co. in Amsterdam (1968), particularly in Chapter 8 (p. 173–277) on Analysis and Synthesis of Speech Processes. These publications and the publications referenced therein provide non-essential subject matter and are incorporated herein by reference.

Terminology used in this description will now be defined to more clearly illustrate the intended meaning.

The term "word" is intended to mean a generalized parameter comprising a plurality of digital bits or other conditions and may relate to letters, numbers, combinations of letters and numbers, or other such groups of conditions.

The computer system of the referenced application Ser. No. 101,881 exemplifies a system that can be used to implement this invention. The data processor and input/output structure of that parent application are used to illustrate one form of this invention.

The terms computer and data processor are each intended to mean an arrangement for processing signals. In a preferred embodiment, the computer or data processor is a stored program digital computer or stored program digital data processor as exemplified in the parent applications.

The term computer as used in the description of a preferred embodiment herein is intended to mean a stored program digital data processor. This includes the well known prior art general purpose digital computers such as mini-computers, but also includes the monolithic data processor and factored data processor disclosed in the referenced application Ser. No. 101,881, and the extension of these data processor concepts to higher levels of integration; where the computer may be distributed throughout the system and may be physically and operationally associated with an extremity of the system, or the computer may be merged to such a degree that the component computer parts are individually indistinguishable.

A dedicated computer system may be dedicated to one or more tasks which may include a prime task such as numerical control, payroll processing, or calculator processing and one or more sub-tasks such as controlling extremities. Also, the data processor need not maintain it's physical or operational identity. Also, this invention is not limited to a single computer but may include a plurality of computers associated with various portions of the prime task and sub-tasks.

A data processing system can be structured with 1. extremities that may have a physical size and form and 2. monolithic data processors that may have relative inconsequential size and form; where the data processors can be totally distributed to the extremity for performance of the functions of the extremity under program control and may be dedicated to one or more extremities. In this case, a plurality of data processors may be distributed throughout the system, each dedicated to a data processor prime task, which may be a system prime task or sub-task.

The term hybrid is herein intended to pertain to both, analog and digital, signal processing. In particular, the analog-to-digital and digital-to-analog converters described herein are hybrid arrangements.

The audionic device described herein is described in relation to an audio speech reply system which exemplifies the general principles of this invention. It will become obvious to those skilled in the art that the audionic device is not limited to speech replies, but is generally applicable to any audio signals. For example, the sense of hearing can be stimulated by transducers mounted on a sensitive portion of an operator such as a bone in proximity with an ear as with hearing aid type devices. This type of signal transmission and other forms of signal transmission are intended to be included within the broad scope of this invention. Also, the principles disclosed herein are widely applicable to the general construction of signals by electronic means and not limited to audio signals. This invention is therefore intended to be interpreted in broad form to cover general signal construction such as light, sound, electronic signals, and others that will become obvious to those skilled in the art.

An audionic device is herein intended to mean a device for digitally generating audio messages and replies. The operator may be located in close proximity with the audionic device or may be located remotely such as with receiving the audio reply over a telephone link.

A monolithic audionic system is intended to mean an audionic system comprising an integrated circuit or monolithic computer including an integrated circuit audionic memory for storage of audionic information.

The use of audionic message sub-systems may improve the performance of systems with which the audionic sub-system is associated. Various systems described herein use the digital audionic device of this invention. It will become obvious that these systems may also provide some advantages with the use of mechanical and analog filter arrangements. Therefore, the claimed inventive features relating to application of audionic systems are intended to be generally interpreted in broad terms to cover the use of all forms of audio devices that can provide the audio capability described herein. The digital audionic arrangement of this invention provides a preferred embodiment of such an audio message arrangement.

As used in this application, a stored program computer is said to be operating on a real time basis when time of occurance of the computer operations in a data processing subsystem is dictated by the requirements of a peripheral subsystem or external devices rather than by computer operations.

It is thus clearly seen that the present invention provides a novel means and method of providing a data processor system for operator interaction through audionic messages.

From the above description it will be apparent that there is thus provided a device of the character described possessing the particular features of advantage before enumerated as desireable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A monolithic system for communicating with an operator, said system comprising:
   command means for generating at least one output signal, wherein said command means comprises monolithic data processor means for processing digital sound information and read only memory means for storing the sound information; and
   sound means for generating a sound message in response to the output signal, wherein said sound means comprises monolithic signal processing means for processing the output signal and transducer means for generating a sound message in response to the processed output signal.

2. The command means as set forth in claim 1 above further comprising a stored program computer for processing the digital sound information in response to a stored program and means for storing the program.

3. The system as set forth in claim 1 above further comprising input means for generating an input signal related to a monitored signal wherein said command means includes means for generating the output signal in response to the input signal.

4. The system as set forth in claim 1 above further comprising:
   input means for generating at least one input signal, wherein said command means includes means for generating the output signal in response to the input signal; and
   communication means for communicating the output signal from said command means to said sound means, wherein said sound means is located remotely relative to said command means.

5. The system as set forth in claim 1 above further comprising display means for displaying information in response to the output signal.

6. The system as set forth in claim 1 above wherein said command means includes means for processing time information and means for generating the output signal related to a time message in response to the processing of time information.

7. The system as set forth in claim 1 above further comprising manually operable input means for generating at least one input signal, said command means further comprising means for generating the output signal in response to the input signal.

8. The system as set forth in claim 1 above further comprising input means for generating an input signal in response to a sound signal, said command means further comprising means for generating digital sound information related to the sound signal in a form useable by a means for generating sound messages in response to the input signal.

9. A system for communicating with an operator, said system comprising:
   command means for generating at least one output signal, said command means comprising
   a. memory means for storing digital information, said memory means comprising a first memory portion for storing a plurality of instructions of a stored program and a second memory portion for storing sound information, said memory means further comprising an integrated circuit read only memory; and
   b. stored program computer means for processing the sound information to generate the output signal in response to the stored program; and
   sound means for generating a sound message in response to the output signal.

10. The system as set forth in claim 9 above further comprising input means for generating an input signal related to a monitored signal, wherein said command means further comprises means for generating the output signal in response to the input signal to provide the sound message related to the monitored signal.

11. The system as set forth in claim 9 above further comprising input means for generating an input signal related to a speech message, wherein said command means further comprises means for generating a digital signal related to the speech message in response to the input signal and means for generating the output signal in response to the digital signal; said system further comprising communication means for communicating the output signal to said sound means, wherein said sound means is located remotely in relation to said command means.

12. The system as set forth in claim 9 above further comprising display means for displaying information in response to the output signal.

13. The system as set forth in claim 9 above wherein said command means further comprises means for processing time information and means for generating the output signal in response to the processed time information and wherein said sound means generates a time information sound message in response to the time information related output signal.

14. The system as set forth in claim 9 above further comprising keyboard means for generating a keyboard input signal in response to operator action; said command means further comprising means for generating the output signal in response to the keyboard input signal.

15. The system as set forth in claim 9 above further comprising input means for generating an input signal in response to a sound signal, wherein said command means further comprises means for generating digital representations of the sound information in response to the input signal.

16. A data processing system for operator interaction comprising:
   stored program computer means for processing digital sound information in response to a stored program; said computer means comprising memory means for storing digital information; said memory means comprising a first memory portion for storing the program having a plurality of instructions and a second memory portion for storing digital sound information; and said computer means including means for generating at least one output signal in response to the processing; and
   audio means for generating a sound message in response to the output signal; said audio means comprising means for receiving the output signal, signal processing means for processing the output signal, and sound transducer means for generating the sound message in response to the processed output signal, wherein said data processing system is a monolithic system; wherein said memory means comprises monolithic read only memory means for storing the instructions and for storing the sound information and monolithic alterable memory means for storing intermediate information under program control; wherein said computer means further comprises monolithic execution means for processing sound information in response to the stored instructions; and wherein said signal processing means comprises monolithic means for processing at least one signal.

17. The system as set forth in claim 16 above, wherein said data processing system is digital audionic system; wherein the output signal is a digital output signal related to a desired sound; and wherein said signal processing means comprises converter means for generating an analog output signal in response to the digital output signal.

18. The system as set forth in claim 16 above, wherein said system is multi-terminal system, said multi-terminal system including means for sharing said computer means with each of said plurality of terminals.

19. The system as set forth in claim 16 above further comprising display means for displaying information in response to the output signal.

20. The system as set forth in claim 16 above wherein said stored program computer means includes means for processing time information and wherein the sound message generated with said audio means is a time related sound message.

21. The system as set forth in claim 16 above further comprising input means for generating an input signal in response to a monitored signal, wherein said computer means further comprises means for generating the output signal in response to the input signal.

22. The system as set forth in claim 16 above further comprising input means for generating an input signal related to a sound message; said input means including transducer means for generating an input electrical signal in response to a sound signal and converter means for generating a digital input signal in response to the input electrical signal; wherein said computer means further comprises means for generating digital information related to the sound information in response to the input signal.

23. A multi-terminal system for communicating with a plurality of operators, said multi-terminal system comprising:
- data processor means for generating a plurality of output signals in response to a plurality of input signals;
- a plurality of terminal means each arranged for communicating with an operator;
- input means included in each of said terminal means for generating at least one of said input signals; and
- audionic means included in each of said terminal means for generating a speech message in response to at least one of the output signals.

24. The system as set forth in claim 23 above, wherein said data processor means is shared between a plurality of said terminal means; said data processor means comprising memory means for storing information relates to the speech messages.

25. The system as set forth in claim 23 above wherein said data processor means comprises a stored program computer for generating the output signals under control of a stored program, said computer comprising memory means for storing the program and execution means for generating the output signals in response to the input signals under control of the stored program.

26. The system as set forth in claim 23 above further comprising display means included in each of said terminal means for generating a display in response to at least one of the output signals.

27. A system for generating digital representations of sound messages said system comprising:
- input means for generating sound information;
- processor means for processing the sound information to generate digital information related to the sound information in a form useable by a means for generating sound messages;
- transmitter means for transmitting the digital information to a remote location;
- receiver means at the remote location for receiving the digital information; and
- sound generation means for generating sound messages in response to the received digital information.

28. A data concentrator system for communicating speech messages in digital form, said system comprising:
- operator input means for generating at least one operator input signal, wherein said operator means includes operator actuable means for generating the input signal;
- speech input means for generating a speech input signal in response to a speech message;
- data processor means for generating at least one output signal in response to at least one of the input signals, wherein said data processor means comprises means for generating the output signal in response to at least one of the input signals;
- speech means for generating of speech message in response to the output signal; and
- communication means for communicating the output signal to said speech means, wherein said speech is located remote from said data processor means.

29. The system as set forth in claim 28 above wherein said data processor means comprises stored program computer means for processing digital sound information in response to a plurality of stored instructions; said computer means comprising memory means for storing the intructions and execution means for processing the digital sound information in response to the stored instructions.

30. The system as set forth in claim 28 comprising display means for generating a display message in response to the output signal.

31. The system as set forth in claim 28 above wherein said system is a time message system, wherein said data processor means comprises means for generating the output signal in relation to time information, and wherein the output speech message is related to time.

* * * * *